United States Patent
Wu et al.

(10) Patent No.: US 11,581,268 B2
(45) Date of Patent: Feb. 14, 2023

(54) SEMICONDUCTOR PACKAGE WITH REDISTRIBUTION STRUCTURE AND MANUFACTURING METHOD THEREOF

(71) Applicant: Taiwan Semiconductor Manufacturing Company, Ltd., Hsinchu (TW)

(72) Inventors: Wei-Cheng Wu, Hsinchu (TW); Chien-Chia Chiu, Taoyuan (TW); Cheng-Hsien Hsieh, Kaohsiung (TW); Li-Han Hsu, Hsin-Chu (TW); Meng-Tsan Lee, Hsinchu (TW); Tsung-Shu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/542,527

(22) Filed: Dec. 6, 2021

(65) Prior Publication Data
US 2022/0093526 A1    Mar. 24, 2022

Related U.S. Application Data

(63) Continuation of application No. 16/893,440, filed on Jun. 5, 2020, now Pat. No. 11,195,802.
(Continued)

(51) Int. Cl.
*H01L 23/552* (2006.01)
*H01L 21/56* (2006.01)
(Continued)

(52) U.S. Cl.
CPC ............ *H01L 23/552* (2013.01); *H01L 21/56* (2013.01); *H01L 21/76802* (2013.01);
(Continued)

(58) Field of Classification Search
CPC . H01L 23/552; H01L 21/56; H01L 21/76802; H01L 21/76877; H01L 23/488; H01L 23/5384; H01L 24/14
(Continued)

(56) References Cited

U.S. PATENT DOCUMENTS 9,000,584 B2    4/2015    Lin et al.
9,048,222 B2    6/2015    Hung et al.
(Continued)

*Primary Examiner* — Didarul A Mazumder
(74) *Attorney, Agent, or Firm* — JCIPRNET

(57) ABSTRACT

A semiconductor package includes a semiconductor die, a redistribution structure and connective terminals. The redistribution structure is disposed on the semiconductor die and includes a first metallization tier disposed in between a pair of dielectric layers. The first metallization tier includes routing conductive traces electrically connected to the semiconductor die and a shielding plate electrically insulated from the semiconductor die. The connective terminals include dummy connective terminals and active connective terminals. The dummy connective terminals are disposed on the redistribution structure and are electrically connected to the shielding plate. The active connective terminals are disposed on the redistribution structure and are electrically connected to the routing conductive traces. Vertical projections of the dummy connective terminals fall on the shielding plate.

20 Claims, 26 Drawing Sheets

SP1

Related U.S. Application Data

(60) Provisional application No. 62/906,119, filed on Sep. 26, 2019.

(51) Int. Cl.
*H01L 21/76* (2006.01)
*H01L 21/768* (2006.01)
*H01L 23/31* (2006.01)
*H01L 23/488* (2006.01)
*H01L 23/538* (2006.01)
*H01L 23/00* (2006.01)

(52) U.S. Cl.
CPC ........ *H01L 21/76877* (2013.01); *H01L 23/31* (2013.01); *H01L 23/488* (2013.01); *H01L 23/5384* (2013.01); *H01L 24/14* (2013.01)

(58) Field of Classification Search
USPC .......................................................... 257/659
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2017/0033063 A1* | 2/2017 | Lin | H01L 23/31 |
| 2017/0271283 A1* | 9/2017 | Lee | H01L 24/11 |
| 2018/0047571 A1* | 2/2018 | Hunt | H01L 24/45 |
| 2018/0261557 A1* | 9/2018 | Yu | H01L 23/562 |
| 2019/0131235 A1* | 5/2019 | Wang | H01L 21/76885 |
| 2019/0131253 A1* | 5/2019 | Lee | H01L 24/19 |

* cited by examiner

SEMICONDUCTOR PACKAGE WITH REDISTRIBUTION STRUCTURE AND MANUFACTURING METHOD THEREOF

CROSS-REFERENCE TO RELATED APPLICATION

This application is a continuation application of U.S. application Ser. No. 16/893,440, filed on Jun. 5, 2020. The prior application Ser. No. 16/893,440 claims the priority benefits of U.S. application Ser. No. 62/906,119, filed on Sep. 26, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 8A are schematic cross-sectional views illustrating portions of structures produced during a manufacturing process of a semiconductor package in accordance with some embodiments of the disclosure.

FIG. 3B through FIG. 8B are schematic cross-sectional views illustrating portions of structures produced during a manufacturing process of a semiconductor package in accordance with some embodiments of the disclosure.

DETAILED DESCRIPTION

Figure 1A:
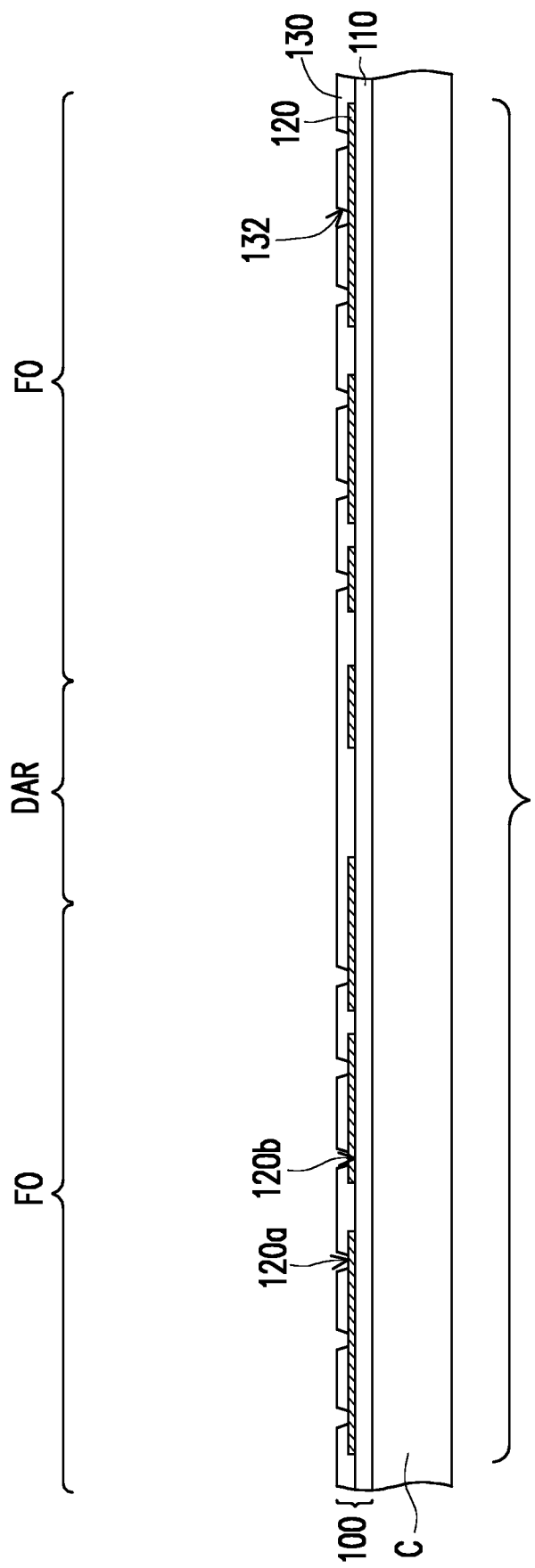
FIG. 1A to FIG. 1E are schematic cross-sectional views illustrating structures produced during a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views illustrating structures produced during a manufacturing process of a semiconductor package SP1 in accordance with some embodiments of the disclosure. Referring to FIG. 1A, a carrier C may be provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) may be formed over the carrier C. In some embodiments, the de-bonding layer includes a light-to-heat conversion (LTHC) release layer, which facilitates peeling the carrier C away from the semiconductor device when required by the manufacturing process.

In some embodiments, a redistribution structure 100 is formed over the carrier C. In some embodiments, the redistribution structure 100 is formed on the de-bonding layer (not shown). In some embodiments, the redistribution structure 100 includes an outer dielectric layer 110, a metallization tier 120, and an inner dielectric layer 130. In some embodiments, the outer dielectric layer 110 is formed over the carrier C, and the metallization tier 120 and the inner dielectric layer 130 are sequentially provided on the outer dielectric layer 110. The metallization tier 120 may be disposed between the outer dielectric layer 110 and the inner dielectric layer 130. In some embodiments, the metallization tier 120 includes routing conductive traces sandwiched between the outer dielectric layer 110 and the inner dielectric layer 130. In some embodiments, the inner dielectric layer 130 may be patterned to include openings 132 exposing portions of the metallization tier 120. In some embodiments, the redistribution structure 100 may include a die attach region DAR without openings in the inner dielectric layer 130, and a fan-out region FO beside the die attach region DAR in which the openings 132 are formed. In some embodiments, the die attach region DAR is located towards a central portion of the inner dielectric layer 130, and is surrounded by the fan-out region FO. In some embodiments, the fan-out region FO may have an annular shape encircling the die attach region DAR. In some embodiments, portions of a first surface 120a of the metallization tier 120 are exposed by the inner dielectric layer 130. A second surface 120b opposite to the first surface 120a may be (temporarily) covered by the outer dielectric layer 110. In some embodiments, a material of the metallization tier 120 includes copper, aluminum, or the like. In some embodiments, the material of the metallization tier 120 includes copper. Throughout the description, the term "copper" is intended to include substantially pure elemental copper, copper containing unavoidable impurities, and copper alloys containing elements such as tantalum, indium, tin, zinc, manganese, chromium, titanium, germanium, strontium, platinum, magnesium, aluminum, or zirconium. The metallization tier 120 may be formed by, for example, electroplating, deposition, and/or photolithography and etching. In some embodiments, a material of the inner dielectric layer 130 and the outer dielectric layer 110 independently includes polyimide, epoxy resin, acrylic resin, phenol resin, benzocyclobutene (BCB), polybenzooxazole (PBO), combinations thereof, or any other suitable polymer-based dielectric material. The outer dielectric layer 110 and the inner dielectric layer 130, for example, may be formed by suitable fabrication techniques such as spin-on coating, chemical vapor deposition (CVD), or the like. In some alternative embodiments, more metallization tiers and more dielectric layers than the ones illustrated in FIG. 1A may be formed depending on production requirements. In these embodiments, each metallization tier may be sandwiched between consecutive dielectric layers. In some embodiments, the redistribution structure 100 is referred to as a backside redistribution structure.

Figure 1B:
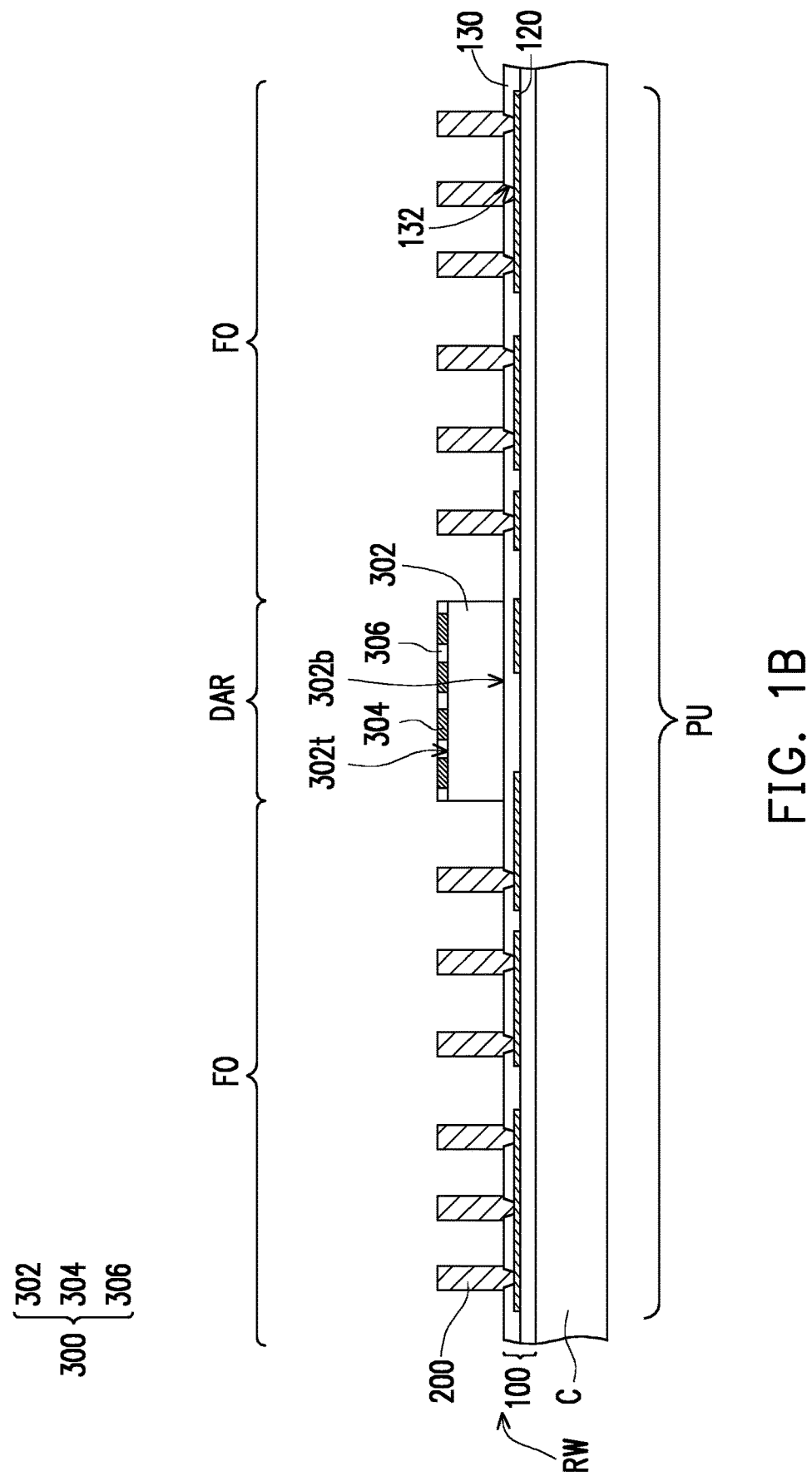

Referring to FIG. 1B, a plurality of through insulator vias (TIVs) 200 is formed on the redistribution structure 100. In some embodiments, the TIVs 200 are formed in the fan-out region FO in correspondence of the openings 132. For example, the TIVs 200 are plated on the exposed portions of the metallization tier 120. In some embodiments, the TIVs 200 may be formed as described below. First, a seed material layer (not shown) is formed over the inner dielectric layer 130. In some embodiments, the seed material layer includes a titanium/copper composite layer and is formed by a sputtering process to conformally cover the inner dielectric layer 130. The seed material layer may extend within the openings 132 to contact the exposed portions of the metallization tier 120. Thereafter, a patterned auxiliary mask (not shown) with openings is formed on the seed material layer. The openings of the auxiliary mask expose the intended locations for the subsequently formed TIVs 200. For example, the openings of the auxiliary mask are formed in correspondence of the locations of the openings 132. Afterwards, a plating process is performed to form a metal material layer (e.g., a copper layer) on the seed material layer exposed by the openings of the auxiliary mask. Subsequently, the auxiliary mask and the seed material layer not covered by the metal material layer are removed, for example via a stripping process and an etching process, to form the TIVs 200. However, the disclosure is not limited thereto. In some alternative embodiments, other suitable methods may be utilized to form the TIVs 200. For example, pre-fabricated TIVs 200 (e.g., pre-fabricated copper pillars) may be picked-and-placed onto the redistribution structure 100.

In some embodiments, referring to FIG. 1B, semiconductor dies 300 are provided on the carrier C. In some embodiments, the semiconductor dies 300 are placed onto the carrier C through a pick-and-place method. Even though only one semiconductor die 300 is presented in FIG. 1B for illustrative purposes, a plurality of semiconductor dies 300 may be provided on the carrier C to produce multiple package units PU with wafer-level packaging technology. Furthermore, even though the package unit PU is shown in FIG. 1B to include a single semiconductor die 300, the disclosure is not limited thereto. In some alternative embodiments, a package unit PU may include multiple semiconductor dies 300. In some embodiments, an individual semiconductor die 300 includes a semiconductor substrate 302, contact pads 304, and a passivation layer 306. The contact pads 304 may be formed on a top surface 302t of the semiconductor substrate 302. In some embodiments, the passivation layer 306 may expose at least a portion of each contact pad 304. In some alternative embodiments, the passivation layer 306 may (temporarily) cover the contact pads 304. In some embodiments, the semiconductor die 300 may further include conductive posts (not shown) electrically connected to the contact pads 304 and a protective layer (not shown) surrounding the conductive posts.

In some embodiments, the semiconductor dies 300 are placed on the redistribution structure 100 in the die attach regions DAR with the top surfaces 302t of the semiconductor substrates 302 facing away from the carrier C. Backside surfaces 302b of the semiconductor substrates 302 may face the redistribution structure 100. Portions of die attach film (not shown) may be disposed on the backside surfaces 302b, to secure the semiconductor dies 300 to the inner dielectric layer 130. In some embodiments, the die attach film includes a pressure adhesive, a thermally curable adhesive, or the like.

In some embodiments, the semiconductor substrate 302 may be made of semiconductor materials, such as semiconductor materials of the groups III-V of the periodic table. In some embodiments, the semiconductor substrate 302 includes elemental semiconductor materials, such as crystalline silicon, diamond, or germanium; compound semiconductor materials such as silicon carbide, gallium arsenic, indium arsenide, or indium phosphide, or alloy semiconductor materials such as silicon germanium, silicon germanium carbide, gallium arsenic phosphide, or gallium indium phosphide. In some embodiments, the semiconductor substrate 302 includes active components (e.g., transistors or the like) and optionally passive components (e.g., resistors, capacitors, inductors, or the like) formed therein.

In certain embodiments, the contact pads 304 include aluminum pads, copper pads, or other suitable metal pads. In some embodiments, the passivation layer 306 may be a single layer or a multi-layered structure, including a silicon oxide layer, a silicon nitride layer, a silicon oxy-nitride layer, a dielectric layer formed by other suitable dielectric materials, or combinations thereof.

The semiconductor die(s) 300 included in a package unit PU may be or include a logic die, such as a central processing unit (CPU) die, a graphic processing unit (GPU) die, a micro control unit (MCU) die, an input-output (I/O) die, a baseband (BB) die, a field-programmable gate array (FPGA), an application processor (AP) die, or the like. The disclosure is not limited by the number or type of dies used for the semiconductor dies 300 within a package unit PU.

Figure 1C:
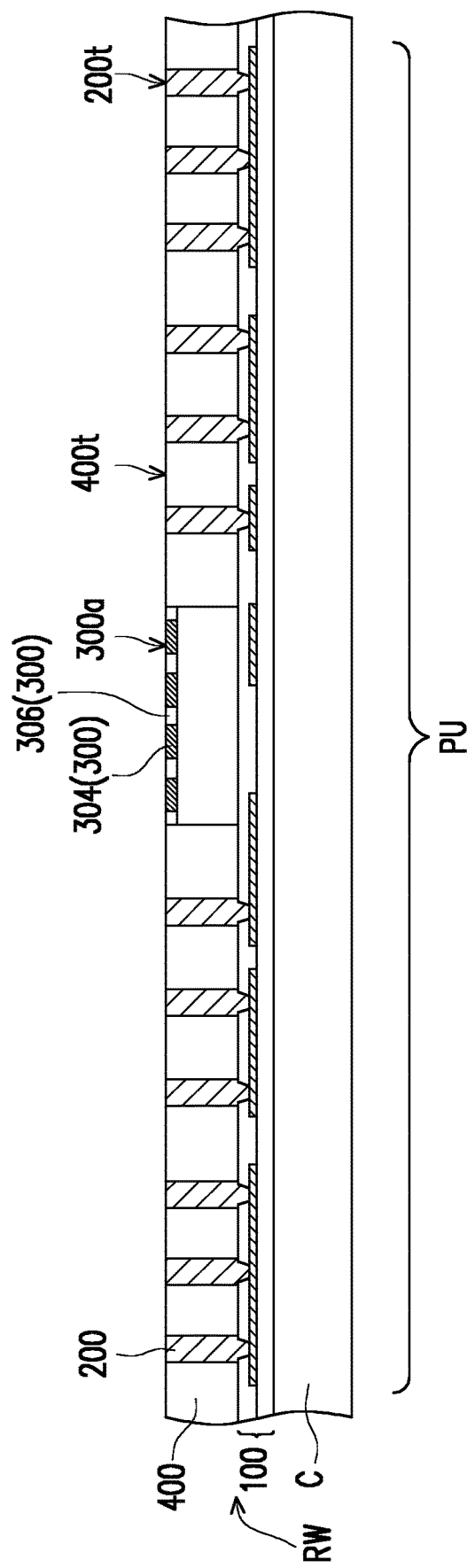

Referring to FIG. 1C, an encapsulant 400 is formed over the redistribution structure 100 to encapsulate the TIVs 200 and the semiconductor die 300. In some embodiments, a material of the encapsulant 400 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. The encapsulant 400 may be formed by a sequence of over-molding and planarization steps. For example, the encapsulant 400 may be originally formed by a molding process (such as a compression molding process) or a spin-coating process to completely cover the semiconductor die 300 and the TIVs 200. In some embodiments, the planarization of the encapsulant 400 includes performing a mechanical grinding process and/or a chemical mechanical polishing (CMP) process. In some embodiments, the planarization process is performed until the contact pads 304 of the semiconductor die 300 are exposed. In some embodiments, portions of the passivation layer 306 and the TIVs 200 may also be removed during the planarization process of the encapsulant 400. In some embodiments, following the planarization process, the active surface 300a of the semiconductor die 300 (the surface exposing the contact pads 304 or the conductive posts if included), the top surfaces 200t of the TIVs and the top surface 400t of the encapsulant 400 may be substantially at a same level height (be substantially coplanar). As illustrated in FIG. 1C, the encapsulant 400 laterally encapsulates the semiconductor die 300 and the TIVs 200. With the formation of the encapsulant 400, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1C, a single package unit PU is shown for simplicity but, of course, this is for illustrative purposes only, and the disclosure is not limited by the number of package units PU being produced in the reconstructed wafer RW.

Figure 1D:
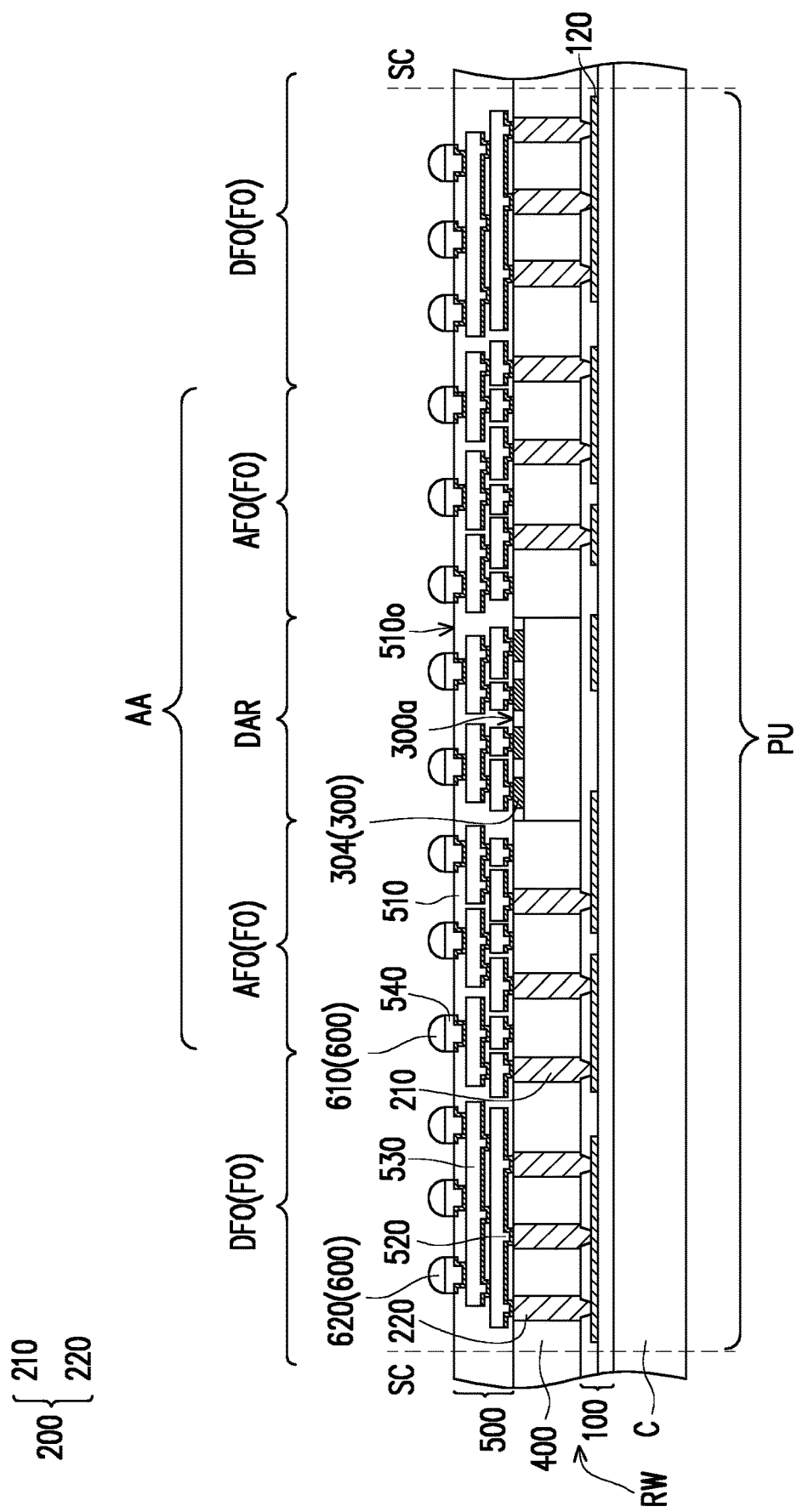

Referring to FIG. 1D, in some embodiments, a redistribution structure 500 is formed on the encapsulant 400, the semiconductor die 300 and the TIVs 200. In some embodiments, the redistribution structure 500 extends throughout the die attach region DAR and the fan-out region FO. In some embodiments, the redistribution structure 500 includes a dielectric layer 510, metallization tiers 520, 530, and under-bump metallurgies 540. For simplicity, the dielectric layer 510 is illustrated as a single dielectric layer and the metallization tiers 520, 530 are illustrated as embedded in the dielectric layer 510. Nevertheless, from the perspective of the manufacturing process, the dielectric layer 510 is constituted by at least two dielectric layers. The metallization tiers 520, 530 are sandwiched between the two adjacent dielectric layers of the dielectric layer 510. The lower metallization tier 520 establishes electrical connection with the TIVs 200 and the contact pads 304 of the semiconductor die(s) 300. The upper metallization tier 530 is stacked over the lower metallization tier 520. In some embodiments, the dielectric layer 510 may be patterned to expose portions of the upper metallization tier 530. The under-bump metallurgies 540 may be conformally formed in the openings of the dielectric layer 510 exposing the upper metallization tier 530. In some embodiments, the under-bump metallurgies 540 further extend over portions of the outer surface 510o of the dielectric layer 510. In some embodiments, the redistribution structure 500 may include one or more stress compliance structures in correspondence of the under-bump metallurgies 540.

Connective terminals 600 are formed on the redistribution structure 500. In some embodiments, the connective terminals 600 are formed on the under-bump metallurgies 540, and are connected to the TIVs 200 and the semiconductor die(s) 300 via the metallization tiers 520, 530. In some embodiments, the connective terminals 600 are attached to the under-bump metallurgies 540 through a solder flux. In some embodiments, the connective terminals 600 are controlled collapse chip connection (C4) bumps. In some embodiments, the connective terminals 600 include a conductive material with low resistivity, such as Sn, Pb, Ag, Cu, Ni, Bi, or an alloy thereof.

In some embodiments, the connective terminals 600 include active connective terminals 610 and dummy connective terminals 620. The active connective terminals 610 may be connected to the semiconductor die(s) 300 and active TIVs 210, while the dummy connective terminals 620 may be connected to dummy TIVs 220. That is, the TIVs 200 may include active TIVs 210 (which may be used for the transmission of signal to and from the semiconductor die(s) 300) and dummy TIVs 220, which may be electrically floating, together with the redistribution conductive traces of the metallization tier 120 to which the dummy TIVs 220 are connected. In some embodiments, the active connective terminals 610 are disposed in the die attach region DAR and in a portion of the fan-out region FO referred to as active fan-out region AFO, while the dummy connective terminals 620 are disposed in a portion of the fan-out region FO referred to as dummy fan-out region DFO. In some embodiments, the active fan-out region AFO is adjacent to the die attach region DAR, and is disposed between the die attach region DAR and the dummy fan-out region DFO. In some embodiments, the active fan-out region AFO surrounds the die attach region DAR and is surrounded by the dummy fan-out region DFO. In some embodiments, the die attach region DAR, the active fan-out region AFO and the dummy fan-out region DFO are concentrically disposed. In some embodiment, the die attach region DAR and the active fan-out region AFO may be considered an active area AA of the package unit PU (and, later on, of the semiconductor package).

Figure 1E:
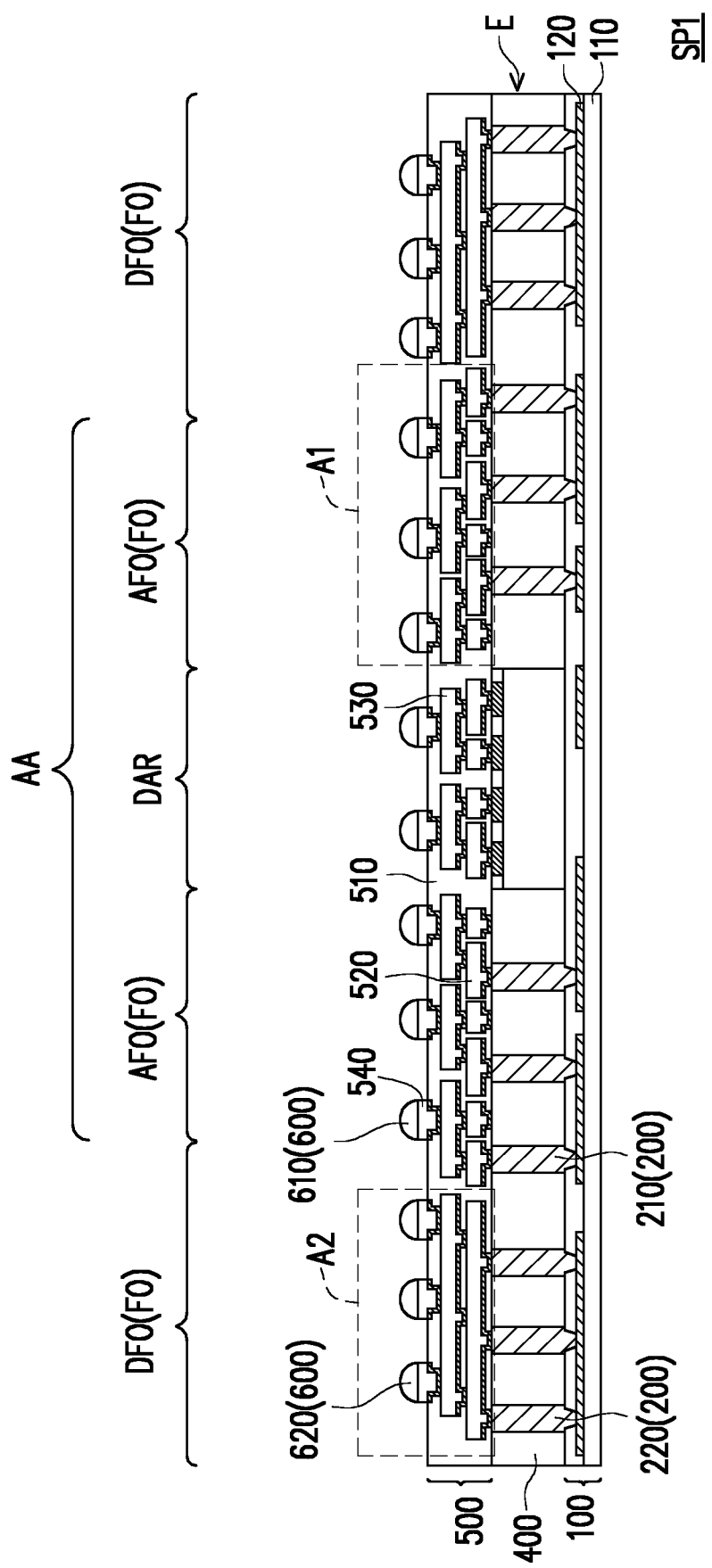

In some embodiments, referring to FIG. 1D and FIG. 1E, a singulation step is performed to separate the individual semiconductor packages SP1, for example, by cutting through the reconstructed wafer RW along the scribe lanes SC arranged between individual package units PU. In some embodiments, the singulation process typically involves performing a wafer dicing process with a rotating blade and/or a laser beam. In some embodiments, the carrier C is separated from the semiconductor packages SP1 following singulation. When the de-bonding layer (e.g., the LTHC release layer) is included, the de-bonding layer may be irradiated with a UV laser so that the carrier C and the de-bonding layer are easily peeled off from the semiconductor packages SP1. Nevertheless, the de-bonding process is not limited thereto, and other suitable de-bonding methods may be used in some alternative embodiments.

FIG. 1E is a schematic cross-sectional view of the semiconductor package SP1 according to some embodiments of the disclosure. The semiconductor package SP1 may include the redistribution structure 100, the TIVs 200, one or more semiconductor dies 300, the encapsulant 400, the redistribution structure 500, and the connective terminals 600. The encapsulant 400 may laterally wrap the TIVs 200 and the semiconductor die(s) 300, and be sandwiched between the redistribution structures 100 and 500. The redistribution structure 500 may include one or more stacked metallization tiers 520, 530 embedded in the dielectric layer 510. Under-bump metallurgies 540 are disposed on the upper metallization tier 530, and connective terminals 600 are disposed on the under-bump metallurgies 540. The connective terminals 600 includes active connective terminals 610 and dummy connective terminals 620. In some embodiments, the outer dielectric layer 110 of the redistribution structure 100 may be patterned to expose portions of the metallization tier 120, and additional conductive terminals (not shown) may be formed in the openings of the outer dielectric layer 110 to provide dual-side electrical connection.

Figure 2A:
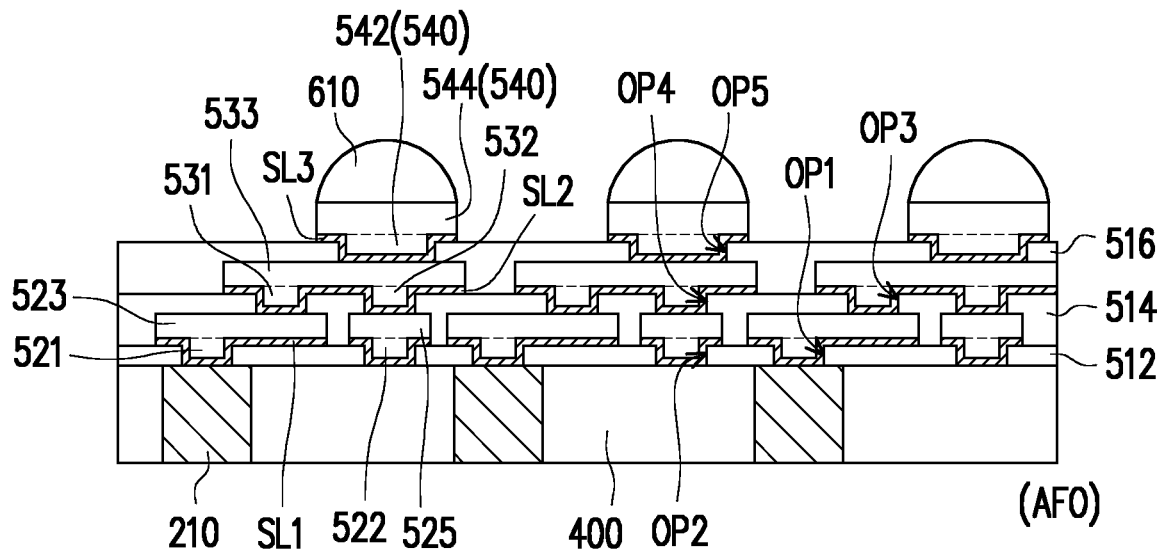
FIG. 2A and FIG. 2B are schematic cross-sectional views illustrating portions of a semiconductor package in accordance with some embodiments of the disclosure.
Figure 2B:
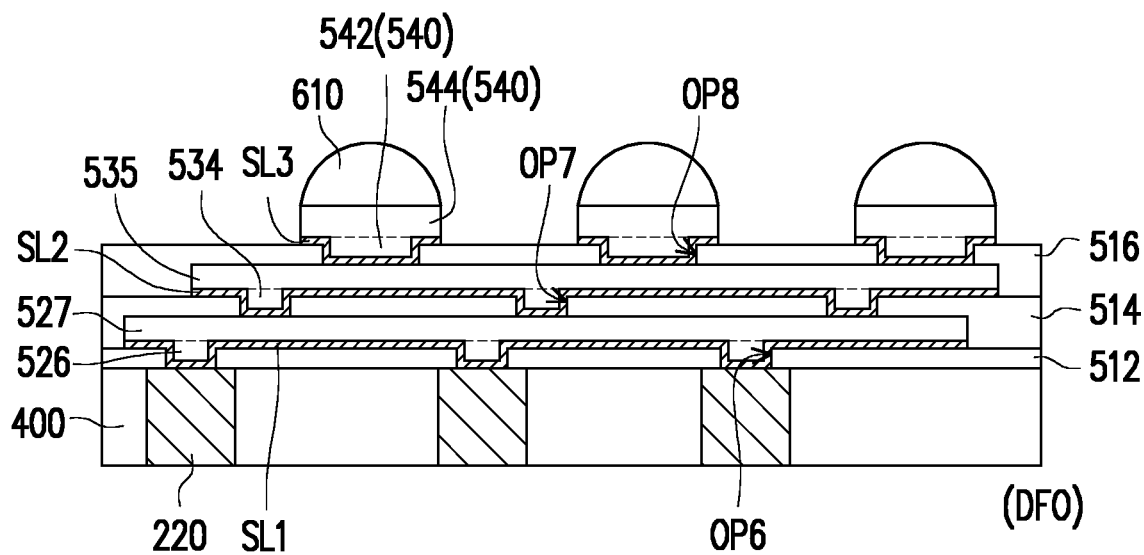

FIG. 2A and FIG. 2B are schematic cross-sectional views of portions of the semiconductor package SP1 of FIG. 1E according to some embodiments of the disclosure. FIG. 2A illustrates details of the redistribution structure 500 and the active connective terminals 610, for example in correspondence of the area A1 of the semiconductor package SP1 illustrated in FIG. 1E. Referring to FIG. 1E and FIG. 2A, the dielectric layer 510 of the redistribution structure 500 includes multiple dielectric layers 512, 514, 516. The innermost dielectric layer 512 extends on the encapsulant 400, the semiconductor die(s) 300 and the TIVs 200, and includes openings OP1 revealing portions of the active TIVs 210 and openings OP2 revealing portions of the encapsulant 400. The lower metallization tier 520 include active conductive vias 521 filing the openings OP1 and establishing electrical connection with the active TIVs 210 and anchor conductive vias 522 filling the openings OP1 and extending over the encapsulant 400. The lower metallization tier 520 further includes routing conductive traces 523 and anchor conductive traces 525. The routing conductive traces 523 extend on the innermost dielectric layer 512 over the openings OP1 and are directly connected to the active conductive vias 521. The anchor conductive traces 525 extend on the innermost dielectric layer 512 over the openings OP2 and are directly connected to the anchor conductive vias 522. In some embodiments, a footprint of an anchor conductive trace 525 may be greater than the underlying anchor conductive via 522. In some embodiments, the routing conductive traces 523 are integrally formed with the active conductive vias 521 they are connected to, and the same applies for the anchor conductive traces 525 and the corresponding underlying anchor conductive vias 522 they are connected to. For example, a single metal trace may form a routing conductive trace 523 and the active conductive vias 521 to which the routing conductive trace 523 is connected, where the portions of the metal trace extending on the innermost dielectric layer 512 may be considered the routing conductive trace 523 and the portions of the metal trace extending in the openings OP1 of the innermost dielectric layer 512 may be considered the active conductive vias 521. The same applies for the anchor conductive traces 525 and the anchor conductive vias 522. In some embodiments, a seed layer SL1 may be formed in between the lower metallization tier 520 and the innermost dielectric layer 512. The seed layer SL1 may be formed below the routing conductive traces 523 and the anchor conductive traces 525, and separate the routing conductive traces 523 and the anchor conductive traces 525 from the innermost dielectric layer 512. In some embodiments, the seed layer SL1 may further line the openings OP1 and OP2 of the innermost dielectric layer, and be interposed between the active conductive vias 521 or the anchor conductive vias 522 and the innermost dielectric layer 512, the active TIVs 210 or the encapsulant 400.

In some embodiments, the routing conductive traces 523 and the anchor conductive traces 525 may be embedded in the intermediate dielectric layer 514. The intermediate dielectric layer 514 may extend on the innermost dielectric layer 512 and be thicker than the routing conductive traces 523 and the anchor conductive traces 525. The intermediate dielectric layer 514 may include openings OP3 exposing portions of the routing conductive traces 523 and openings OP4 exposing portions of the anchor conductive traces 525. In some embodiments, the openings OP4 are vertically aligned with the openings OP2 over the encapsulant 400. The upper metallization tier 530 may include active conductive vias 531, anchor conductive vias 532 and routing conductive traces 533. The active conductive vias 531 are disposed in the openings OP3 of the intermediate dielectric layer 514, and are stacked on the routing conductive traces 523 of the underlying lower metallization tier 520. The anchor conductive vias 532 are disposed in the openings OP4 of the intermediate dielectric layer 514 and are stacked on the anchor conductive traces 525. The routing conductive traces 533 extend on the intermediate dielectric layer 514 and are connected to both the active conductive vias 531 and the anchor conductive vias 532. Similar to what was discussed for the lower metallization tier 520, the routing conductive traces 533 may be integrally formed with the active conductive vias 531 and the anchor conductive vias 532 to which they are connected. In some embodiments, a seed layer SL2 may separate the upper metallization tier 530 from the intermediate dielectric layer 514 and the lower metallization tier 520. The seed layer SL2 may be formed below the routing conductive traces 533 and be interposed between the routing conductive traces 523 and the intermediate dielectric layer 514. In some embodiments, the seed layer SL2 further lines the openings OP3 and OP4 of the intermediate dielectric layer 514, and separate the active conductive vias 531 and the anchor conductive vias 532 from the routing conductive traces 523 and the anchor conductive traces 525, respectively. In some embodiments, the routing conductive traces 533 may be embedded in the outermost dielectric layer 516. The outermost dielectric layer 516 may extend on the intermediate dielectric layer 514 and be thicker than the routing conductive traces 533. The outermost dielectric layer 516 may include openings OP5 exposing portions of the routing conductive traces 533.

In some embodiments, the openings OP5 are vertically aligned with the openings OP4 of the intermediate dielectric layer 514 and the openings OP2 of the innermost dielectric layer 512 over the encapsulant 400. In some embodiments, under-bump metallurgies 540 may be formed on the outermost dielectric layer 516. An under-bump metallurgy 540 may include an under-bump conductive via 542 and a bump support 544. The under-bump conductive via 542 may be disposed in an opening OP5 and be stacked on a routing conductive trace 533 over anchor conductive vias 522, 532 and an anchor conductive trace 525. The bump support 544 may be disposed on the under-bump conductive via 542, and partially extend over the outermost dielectric layer 516. In some embodiments, a seed layer SL3 may separate the under-bump metallurgies 540 from the outermost dielectric layer 516 and the upper metallization tier 530. The seed layer SL3 may be formed between the bump support 544 and the outermost dielectric layer 516, and between the under-bump conductive via 542 and the outermost dielectric layer 516. Similar to what was discussed for the metallization tiers 520, 530, the bump supports 544 may be integrally formed with the under-bump conductive vias 542 on which they are stacked.

Active connective terminals 610 are formed on the bump supports 544. The active connective terminals 610 may be electrically connected to the active TIVs 210 (or the semiconductor die(s) 300) through the under-bump metallurgies 540, the routing conductive traces 533, 523, and the active conductive vias 531, 521. Furthermore, the active connective terminals 610 may be mechanically connected to the encapsulant 400 via the routing conductive traces 533, the anchor conductive vias 532, 522 and the anchor conductive traces 525. By providing anchor conductive vias 532, 522 and an anchor conductive trace 525 below an active connective terminal 610, mechanical stress experienced by or generated at the active connective terminal 610 may be efficiently transmitted to the encapsulant 400. By doing so, the stress (e.g., plastic strain, peeling stress) experienced by the redistribution structure 500 may be reduced and transferred to the molding compound, where it may be dissipated more effectively, thus reducing deformation or delamination of the redistribution structure 500. As such, the reliability and the lifetime of the semiconductor package SP1 may be increased. In some embodiments, not all the active connective terminals 610 are mechanically connected to the encapsulant 400. For example, it may be possible to estimate which active connective terminals 610 may experience stronger mechanical stress during manufacturing or usage, and connect such active connective terminals 610 to the encapsulant 400 through anchor conductive vias and anchor conductive traces. Other active connective terminals 610, located in regions of the semiconductor package SP1 less mechanically stimulated, may only be electrically coupled to the active TIVs 210 or the semiconductor die(s) 300 without being also mechanically connected to the encapsulant 400 via anchor conductive vias and anchor conductive traces. For example, the active connective terminals 610 disposed in the active fan-out region AFO may be mechanically connected to the encapsulant 400, while the active connective terminals 610 disposed in the die attach region DAR may be only electrically connected to the semiconductor die(s) 300. However, the disclosure is not limited thereto. In some alternative embodiments, some active connective terminals 610 in the active fan-out region AFO may also not be mechanically connected to the encapsulant 400.

FIG. 2B illustrates details of the redistribution structure 500 and the dummy connective terminals 620, for example in correspondence of the area A2 within the dummy fan-out region DFO of the semiconductor package SP1 illustrated in FIG. 1E. Referring to FIG. 1E and FIG. 2B, the innermost dielectric layer 512 further includes openings OP6 exposing portions of the dummy TIVs 220. Dummy conductive vias 526 of the lower metallization tier 520 may be disposed in the openings OP6. The lower metallization tier 520 may further include one or more shielding plates 527 extending over the innermost dielectric layer 512 and connecting at least some of the dummy conductive vias 526 with each other. While the following description refers to a shielding plate 527, multiple shielding plates 527 may also be included. In some embodiments, the seed layer SL1 may further extend within the openings OP6, between the dummy conductive vias 526 and the innermost dielectric layer 512, and below the shielding plate 527 on the innermost dielectric layer 512. Similar to what was previously discussed with respect to the routing conductive traces 523 and the active conductive vias 521, also the shielding plate 527 and the dummy conductive vias 526 to which the shielding plate 527 is connected may be integrally formed.

In some embodiments, the shielding plate 527 is embedded in the intermediate dielectric layer 514. The intermediate dielectric layer 514 may be thicker than the shielding plate 527, and may include openings OP7 exposing portions of the shielding plate 527. In some embodiments, different openings OP7 expose the same shielding plate 527. The upper metallization tier 530 may include dummy conductive vias 534 disposed in the openings OP7, and one or more shielding plates 535 extending over the intermediate dielectric layer 514 and connecting with each other by at least some of the dummy conductive vias 534. In some embodiments, the shielding plates 527 and 535 may be vertically stacked, and be connected with each other by the dummy conductive vias 534. Similar to what was discussed for the lower metallization tier 520, the shielding plate 535 may be integrally formed with the dummy conductive vias 534. In some embodiments, the seed layer SL2 may separate the upper metallization tier 530 from the intermediate dielectric layer 514 and the lower metallization tier 520. The seed layer SL2 may be formed below the shielding plate 535 and be interposed between the shielding plate 535 and the intermediate dielectric layer 514. In some embodiments, the seed layer SL2 may further line the openings OP7 of the intermediate dielectric layer 514, and separate the dummy conductive vias 534 from the underlying shielding plate 527.

In some embodiments, the shielding plate 535 is embedded in the outermost dielectric layer 516. The outermost dielectric layer 516 may include openings OP8 exposing portions of the shielding plate 535. In some embodiments, different openings OP8 expose the same shielding plate 535. In some embodiments, the under-bump metallurgies 540 may also be formed in the openings OP8 of the outermost dielectric layer 516. The under-bump conductive via 542 may contact the shielding plate 535. In some embodiments, the seed layer SL3 may also be disposed between the under-bump metallurgies 540 and the shielding plate 535. In some embodiments, multiple under-bump metallurgies 540 formed in different openings OP8 of the outermost dielectric layer 516 may be connected to a same shielding plate 535. As such, the dummy connective terminals 620 formed on these under-bump metallurgies 540 may also be connected to the same shielding plate 535. The dummy connective terminals 620 together with the underlying under-bump metallurgies 540, and the shielding plates 535 and 527 and the dummy conductive vias 534, 526 to which they are connected, may be electrically floating with respect to the active TIVs 210 and the semiconductor die(s) 300. In some embodiments, the shielding plates 535, 527 may effectively dissipate mechanical stress experienced by or generated at the dummy connective terminals 620. That is, by connecting together multiple dummy connective terminals 620 with one or more shielding plates 535, 527, the mechanical stress experienced by the dummy connective terminals 620 may be redistributed through the shielding plates 535, 527 and the dummy TIVs 220 rather than being concentrated in correspondence of the dummy connective terminals 620. As such, deformation or delamination of the redistribution structure 500 may be reduced, thus increasing the lifetime and the reliability of the semiconductor package SP1.

FIG. 3A through FIG. 8A are schematic cross-sectional views of portions of structures produced during a manufacturing process of the semiconductor package SP1 according to some embodiments. The views of FIG. 3A through FIG. 8A may correspond to the area A1 of FIG. 1E also illustrated in FIG. 2A, and may depict structures formed during some steps of the manufacturing of the active fan-out region AFO of the redistribution structure 500 where the anchor conductive vias 522, 532 are formed. FIG. 3B through FIG. 8B are schematic cross-sectional views of portions of structures produced during a manufacturing process of the semiconductor package SP1 according to some embodiments. The views of FIG. 3B through FIG. 8B may correspond to the area A2 of FIG. 1E also illustrated in FIG. 2B, and may depict structures formed during some steps of the manufacturing of the dummy fan-out area DFO of the redistribution structure 500 where the shielding plates 527, 535 are formed. The structures illustrated in FIG. 3A through FIG. 8A and in FIG. 3B through FIG. 8B may correspond to some of the steps performed on the intermediate structure illustrated in FIG. 1C to obtain the structure in FIG. 1D.

Figure 3A:
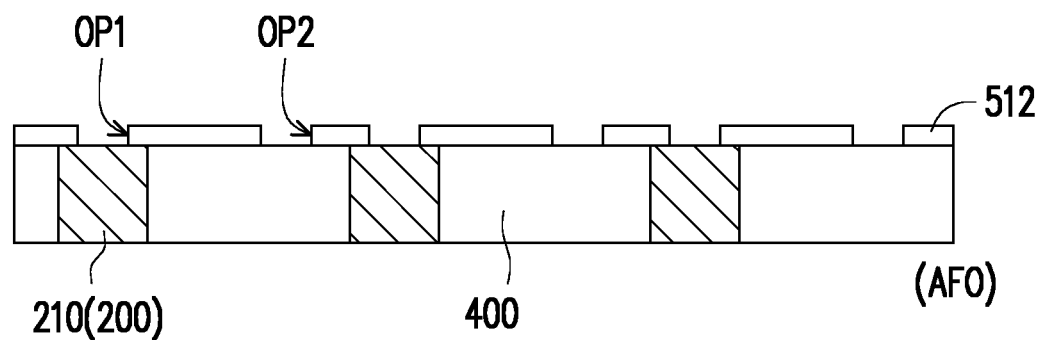
Figure 3B:
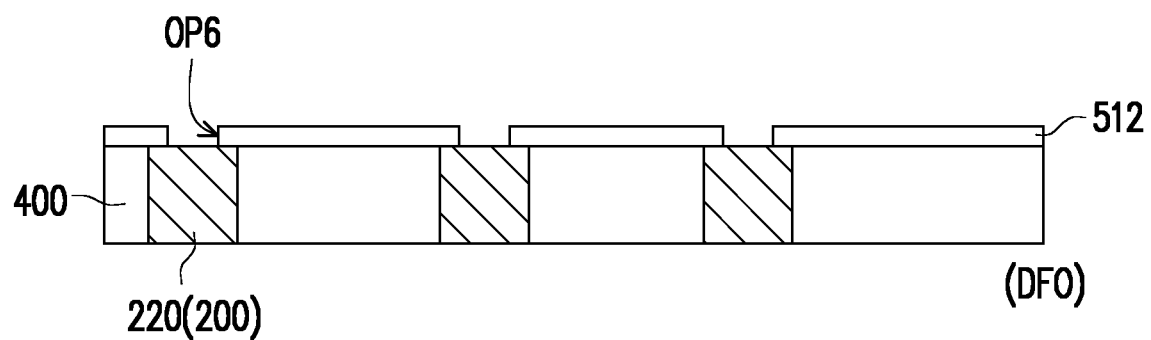

Referring to FIG. 3A and FIG. 3B, in some embodiments, the innermost dielectric layer 512 is formed over the encapsulant 400, the TIVs 200 and the semiconductor die(s) 300 (illustrated, for example, in FIG. 1C). In some embodiments, a material of the innermost dielectric layer 512 includes polyimide, epoxy resin, acrylic resin, phenol resin, benzocyclobutene (BCB), polybenzoxazole (PBO), or any other suitable polymer-based dielectric material. In some embodiments, a precursor dielectric layer (not shown) may be blanketly formed on the intermediate structure of FIG. 1C, for example via spin-coating or suitable deposition techniques such as chemical vapor deposition (CVD), or the like. The precursor dielectric layer may be patterned, for example by etching in presence of an auxiliary mask (not shown), to form the innermost dielectric layer including openings OP1 and OP2 in the active fan-out region AFO and the openings OP6 in the dummy fan-out region DFO. The openings OP1 and OP6 expose portions of the active TIVs 210 and dummy TIVs 220, respectively, while the openings OP3 expose portions of the encapsulant 400.

Figure 4A:
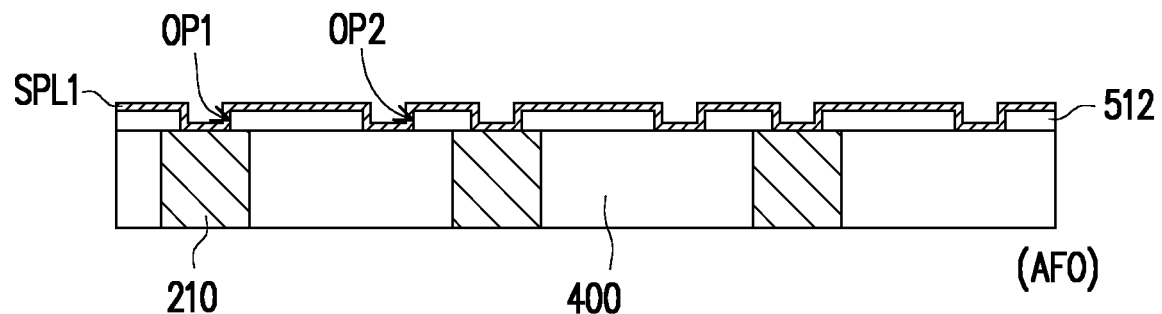
Figure 4B:
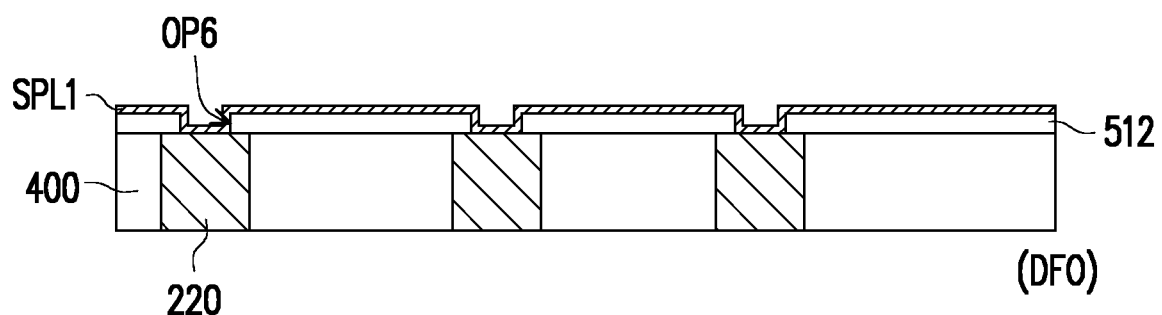

Referring to FIG. 4A and FIG. 4B, in some embodiments a seed precursor layer SPL1 is blanketly formed over the innermost dielectric layer 512. In some embodiments, the seed precursor layer SPL1 is conformally formed over the innermost dielectric layer 512, lining the openings OP1, OP2, and OP6. In some embodiments, the seed precursor layer SPL1 establishes electrical contact with the active TIVs 210 and the dummy TIVs 220. The seed precursor layer SPL1 may be formed through, for example, a sputtering process, a physical vapor deposition (PVD) process, an atomic layer deposition (ALD) process, or the like. In some embodiments, the seed precursor layer SPL1 may include, for example, copper, tantalum, titanium, a combination thereof, or other suitable materials. In some embodiments, a barrier layer (not shown) may be deposited before forming the seed precursor layer SPL1 to prevent out-diffusion of the material of the seed precursor layer SPL1 and the subsequently formed lower metallization tier 520 (illustrated, for example, in FIG. 1D).

Figure 5A:
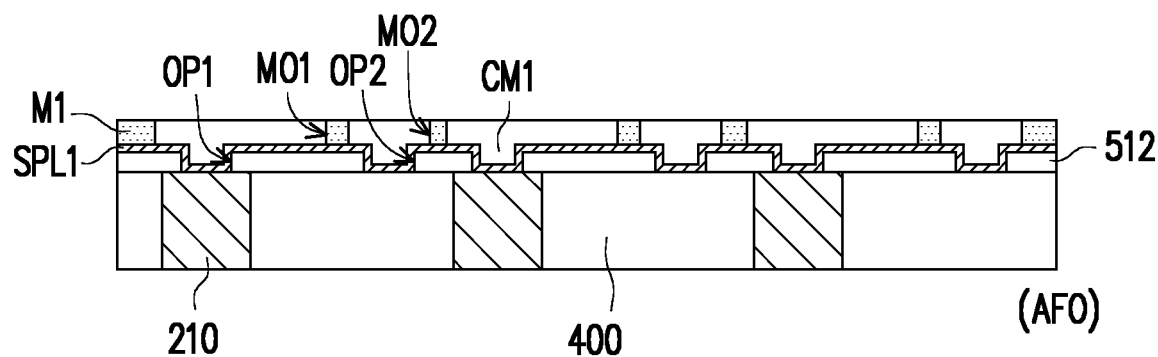
Figure 5B:
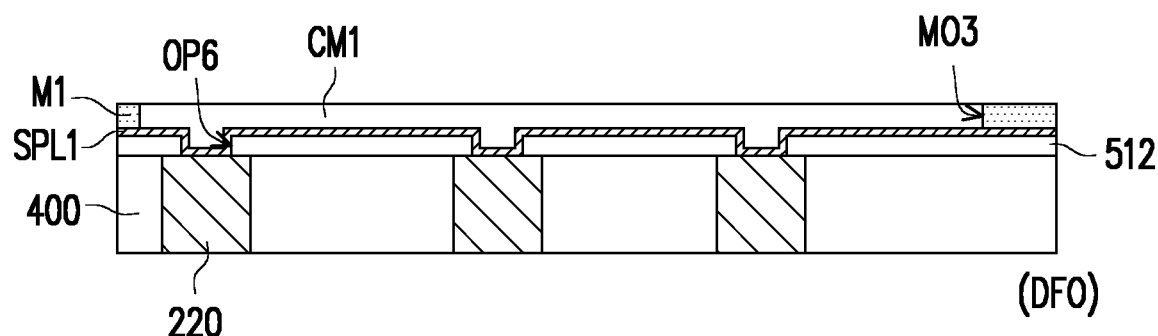

Referring to FIG. 5A and FIG. 5B, a patterned mask M1 is provided on the seed precursor layer SPL1, for example via a sequence of deposition, photolithography, and etching. In some embodiments, a material of the patterned mask M1 may include a positive photoresist or a negative photoresist. In some embodiments, the patterned mask M1 is patterned to include the mask openings M01, M02, and M03. The mask openings M01 are formed in the active fan-out region AFO where the openings OP1 are formed. That is, portions of the seed precursor layer SPL1 extending on the active TIVs 210 may be exposed by the mask openings M01, as well as portions of the seed precursor layer SPL1 extending on the innermost dielectric layer 512 around the openings OP1. The mask openings M02 are also formed in the active fan-out region AFO, but in correspondence of the openings OP2. That is, portions of the seed precursor layer SPL1 extending on the encapsulant 400 are exposed by the mask openings M02. In some embodiments, a mask opening M02 maybe somewhat wider than the opening OP2 it exposes, and the opening OP2 may be fully exposed by the mask opening M02. The mask openings M02 may be smaller (in terms of area) of the openings M01. The mask openings M03 are formed in the dummy fan-out region DFO, and may extend in correspondence of multiple openings OP6. That is, a footprint of a single mask opening M03 may overlie multiple openings OP6, or, alternatively stated, multiple openings OP6 may be connected to the same mask opening M03. In some embodiments, a single mask opening M03 is formed extending throughout the dummy fan-out region DFO, but the disclosure is not limited thereto. In some alternative embodiments, multiple mask openings M03 are formed within the dummy fan-out region DFO. In some embodiments, a mask opening M03 may be wider (in terms of area covered) than a mask opening M01 or M02. In some embodiments, a conductive material CM1 may be formed on the portions of seed precursor layer SPL1 exposed by the mask openings M01, M02, M03 of the patterned mask M1. In some embodiments, the conductive material CM1 may fill the openings OP1, OP2, OP6 of the innermost dielectric layer 512, and further extend over the innermost dielectric layer 512 in the mask openings M01, M02, M03. In some embodiments, the conductive material CM1 may include copper, nickel, tin, palladium, gold, titanium, aluminum, or alloys thereof. In some embodiments, the conductive material CM1 may be formed by a plating process. The plating process is, for example, electro-plating, electroless-plating, immersion plating, or the like.

Referring to FIG. 5A, FIG. 5B, FIG. 6A and FIG. 6B, the patterned mask M1 and the underlying portions of seed precursor layer SPL1 may be removed. In some embodiments, the patterned mask M1 may be removed or stripped through, for example, etching, ashing, or other suitable removal processes. Upon removal of the patterned mask M1, the portions of seed precursor layer SPL1 that are not covered by the conductive material CM1 are removed to render the seed layer SL1 and the lower metallization tier 520. The exposed portions of the seed precursor layer SPL1 may be removed, for example, through an etching process. In some embodiments, the conductive material CM1 may be different from the material of the seed precursor layer SPL1, so the portions of the seed precursor layer SPL1 exposed after removal of the patterned mask M1 may be removed through selective etching. In some embodiments, the conductive material CM1 located in the mask openings M01 forms the active conductive vias 521 and the routing conductive traces 523, the conductive material CM1 located in the mask openings M02 forms the anchor conductive vias 522 and the anchor conductive traces 525, and the conductive material CM1 located in the mask openings M03 forms the dummy conductive vias 526 and the shielding plate 527. As illustrated, the conductive vias 521 may be formed simultaneously and including the same conductive material CM1 as the routing conductive traces 523 to which they are connected. The same applies to the anchor conductive vias 522 with the anchor conductive traces 525, and to the dummy conductive vias 526 with the shielding plate 527.

Figure 7A:
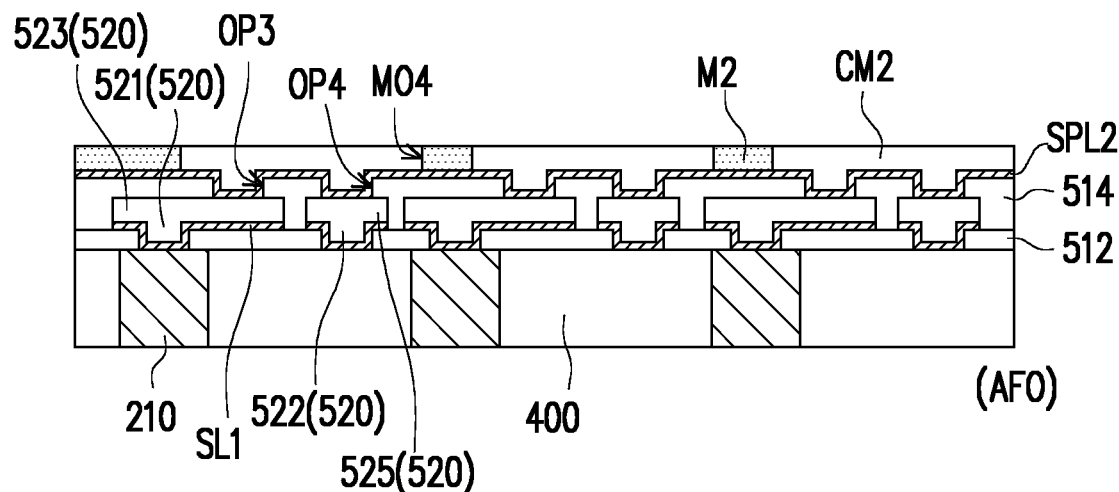
Figure 7B:
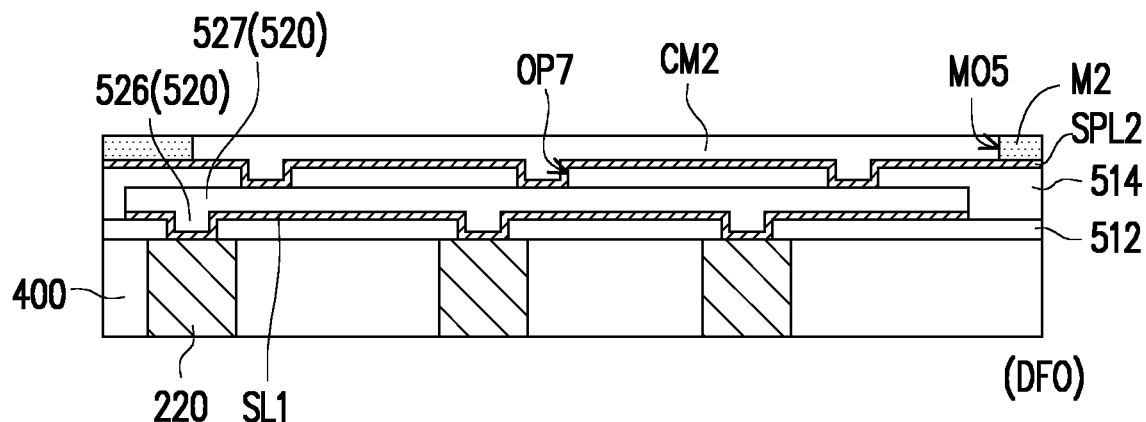
Figure 8A:
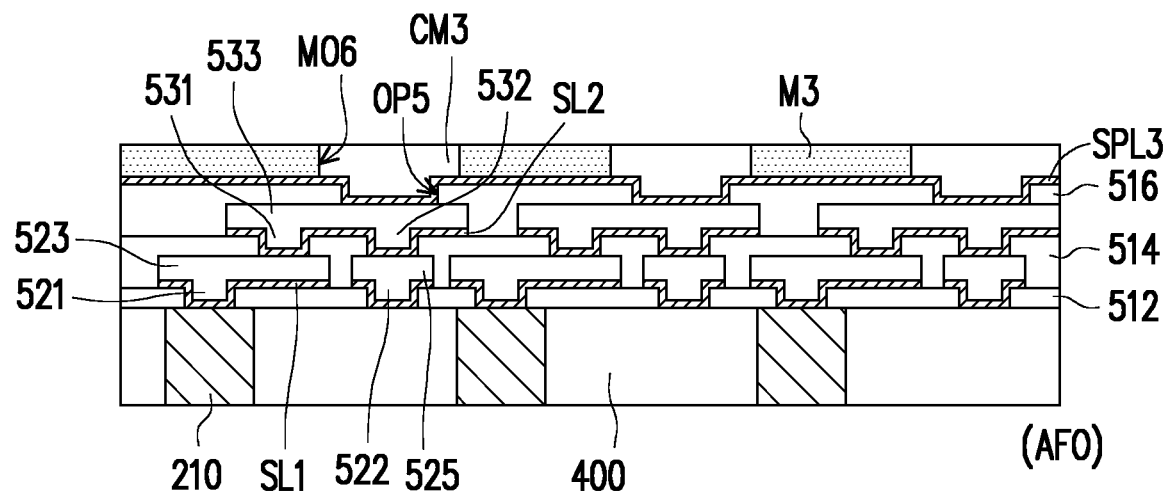
Figure 8B:
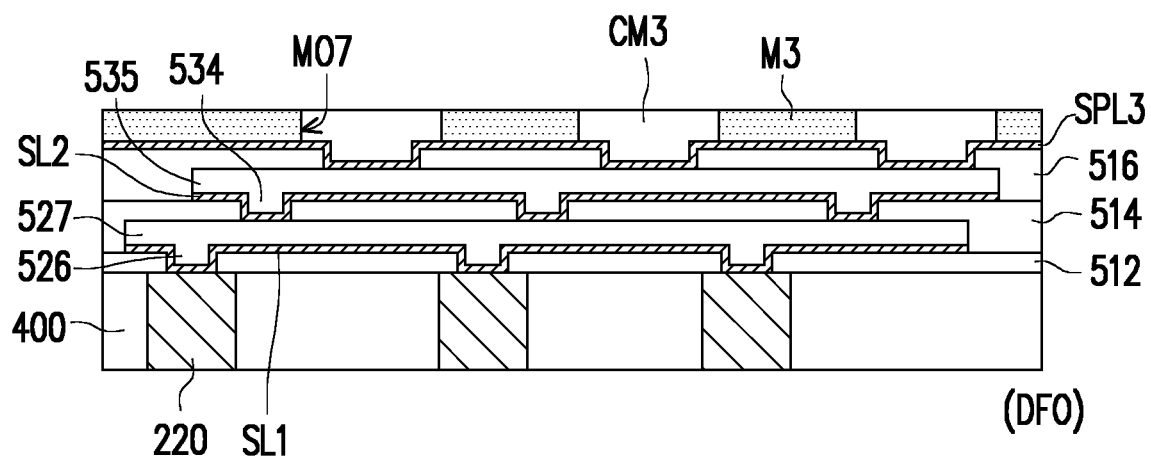

Referring to FIG. 7A and FIG. 7B, the intermediate dielectric layer 514 may be formed on the innermost dielectric layer 512 and the lower metallization tier 520. Materials and manufacturing processes of the intermediate dielectric layer 514 may be similar to the materials and manufacturing processes of the innermost dielectric layer 512 previously discussed. A seed precursor layer SPL2 is formed on the intermediate dielectric layer 514 and the portions of lower metallization tier 520 exposed by the intermediate dielectric layer 514. Materials and manufacturing processes of the seed precursor layer SPL2 may be similar to the materials and manufacturing processes of the seed precursor layer SPL1 discussed with reference to FIG. 4A and FIG. 4B. A patterned mask M2 is provided on the seed precursor layer SPL2. The patterned mask M2 may include similar materials and be manufactured following similar processes as the patterned mask M1, as discussed with reference to FIG. 5A and FIG. 5B. The patterned mask M2 includes mask openings M04 in the active fan-out region AFO, and mask openings M05 in the dummy fan-out region DFO. In some embodiments, the mask openings M04 may connect the openings OP3 and OP4 of the intermediate dielectric layer 514. That is, the mask openings M04 may expose a portion of seed precursor layer SPL2 which contacts both a routing conductive trace 523 and an anchor conductive trace 525. The patterned mask M2 further includes mask openings M05 in the dummy fan-out region DFO. The mask openings M05 may overlie the shielding plate 527 and multiple openings OP7 of the intermediate dielectric layer 514. In some embodiments, a single mask opening M05 is formed extending throughout the dummy fan-out region DFO, but the disclosure is not limited thereto. In some alternative embodiments, multiple mask openings M05 may be formed in dummy fan-out region DFO. In some embodiments, a mask opening M05 is wider (in terms of area covered) than a mask opening M04. In some embodiments, a conductive material CM2 is formed on the portions of seed precursor layer SPL2 exposed by the mask openings M04, M05 of the patterned mask M2. In some embodiments, the conductive material CM2 fills the openings OP3, OP4, OP7 of the intermediate dielectric layer 514, and further extends over the intermediate dielectric layer 514 in the region exposed by the mask openings M04 and M05. The portions of conductive material CM2 located in the openings M04 may be electrically connected to the routing conductive traces 523 of the lower metallization tier 520, as well as to the anchor conductive vias 522 and the anchor conductive traces 525. The conductive material CM2 may include similar materials and be provided with similar processes as previously described for the conductive material CM1 with reference to FIG. 5A and FIG. 5B.

Figure 6A:
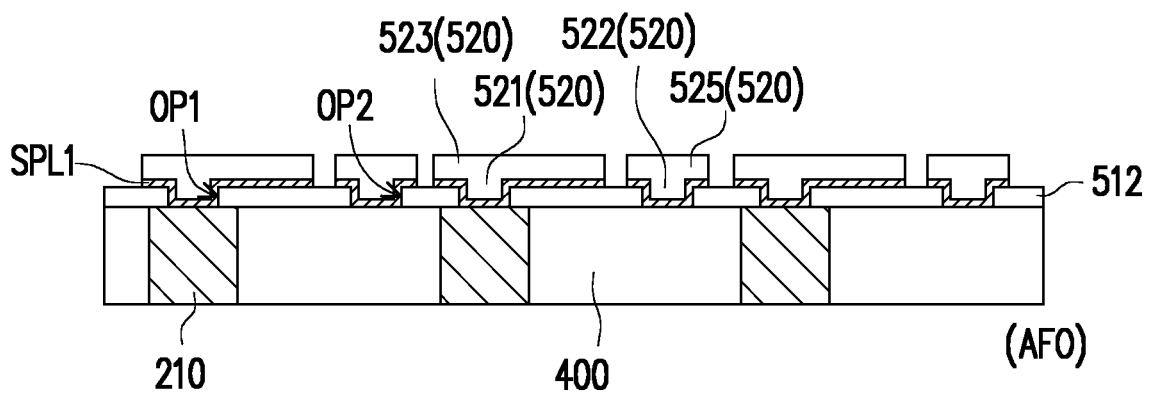
Figure 6B:
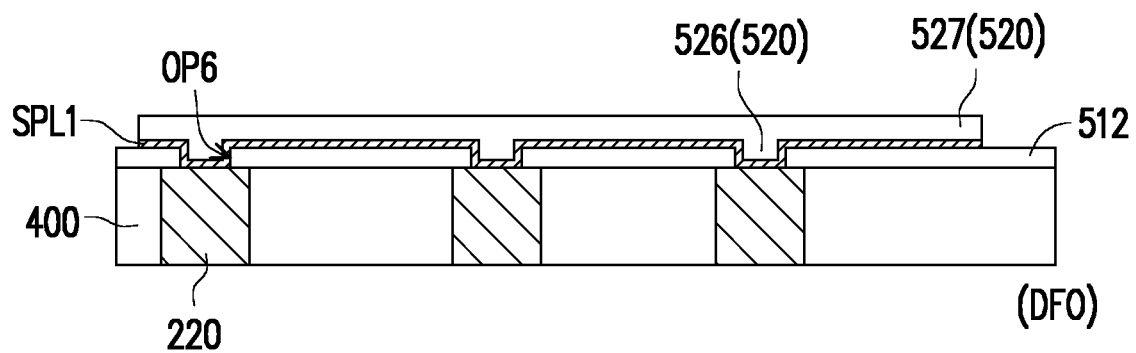

Referring to FIG. 7A, FIG. 7B, FIG. 8A and FIG. 8B, the patterned mask M2 and the underlying portions of seed precursor layer SPL2 may be removed, similar to what was previously described with reference to FIG. 6A and FIG. 6B. Thereafter, the outermost dielectric layer 516 may be formed on the intermediate dielectric layer 514, following similar processes and employing similar materials as previously described for the dielectric layers 512 and 514. A seed precursor layer SPL3 is formed on the outermost dielectric layer 516, similar to what was previously described for the seed precursor layers SPL1 (shown in FIG. 4A and FIG. 4B) and SPL2. A patterned mask M3 is provided on seed precursor layer SPL3. The patterned mask M3 may be provided following similar processes and employing similar materials as the auxiliary masks M1 (illustrated in FIG. 5A and FIG. 5B) and M2. The patterned mask M3 includes mask openings M06 in the active fan-out region AFO and mask openings M07 in the dummy fan-out region DFO. The mask openings M06 are vertically aligned with the anchor conductive vias 532 and 522. An area covered by a mask opening M06 may be wider than the footprints of the underlying anchor conductive vias 532 and 522. However, the disclosure is not limited thereto. In some alternative embodiments, the area covered by a mask opening M06 may be substantially equal to the footprints of the underlying anchor conductive vias 532 and 522. In some embodiments, multiple mask openings M07 open within the footprint of the shielding plate 535. Each mask opening M07 may reveal one of the openings OP8 of the outermost dielectric layer 516. In some embodiments, the area covered by a mask opening M07 in the dummy fan-out region DFO may be comparable with the area covered by a mask opening M06 in the active fan-out region AFO. That is, in the patterned mask M3 formed on the outermost dielectric layer 516, individual mask openings M06 and M07 may have substantially the same shape and size. In some embodiments, a conductive material CM3 is formed on the portions of seed precursor layer SPL3 exposed by the mask openings M06, M07 of the patterned mask M3. In some embodiments, the conductive material CM3 fills the openings OP5, OP8 of the outermost dielectric layer 516, and further extends over the outermost dielectric layer 516 around the openings OP5 and OP8. The portions of conductive material CM3 located in the openings M04 may be electrically connected to the routing conductive traces 533 as well as to the underlying anchor conductive vias 522, 532 and anchor conductive traces 525. In some embodiments, portions of conductive material CM3 located in different mask openings M04 are connected to different routing conductive traces 533 and anchor conductive vias 522, 532. The portions of conductive material CM3 located in the openings M05 are connected to the shielding plate 535. In some embodiments, portions located in different openings M05 are connected to the same shielding plate 535. The conductive material CM3 may include similar materials and be provided with similar processes as previously described for the conductive material CM1 with reference to FIG. 5A and FIG. 5B. In some embodiments, the conductive material CM3 include multiple stacked layers of metallic materials. In some embodiments, the structure of FIG. 1D may be obtained after removal of the patterned mask M3 with the underlying portions of seed precursor layer SPL3 and formation of the connective terminals 600.

It will be apparent that while the manufacturing process of the semiconductor package SP1 has been described with reference to FIG. 1A through FIG. 8B with a redistribution structure 500 including three dielectric layers 512, 514, 516 and two metallization tiers 520, 530, the disclosure is not limited thereto. Redistribution structures including more or fewer metallization tiers and more or fewer dielectric layers can be obtained following similar processes as the ones just described. Furthermore, while the semiconductor package SP1 was illustrated with the redistribution structure 500 having the compliance structures (e.g., the shielding plates 527, 535 and the anchor conductive vias 522, 532) for stress dissipation, in some embodiments the compliance structures may be formed into any other redistribution structure included in a semiconductor package (e.g., the backside redistribution structure 100 of the semiconductor package SP1).

Figure 9:
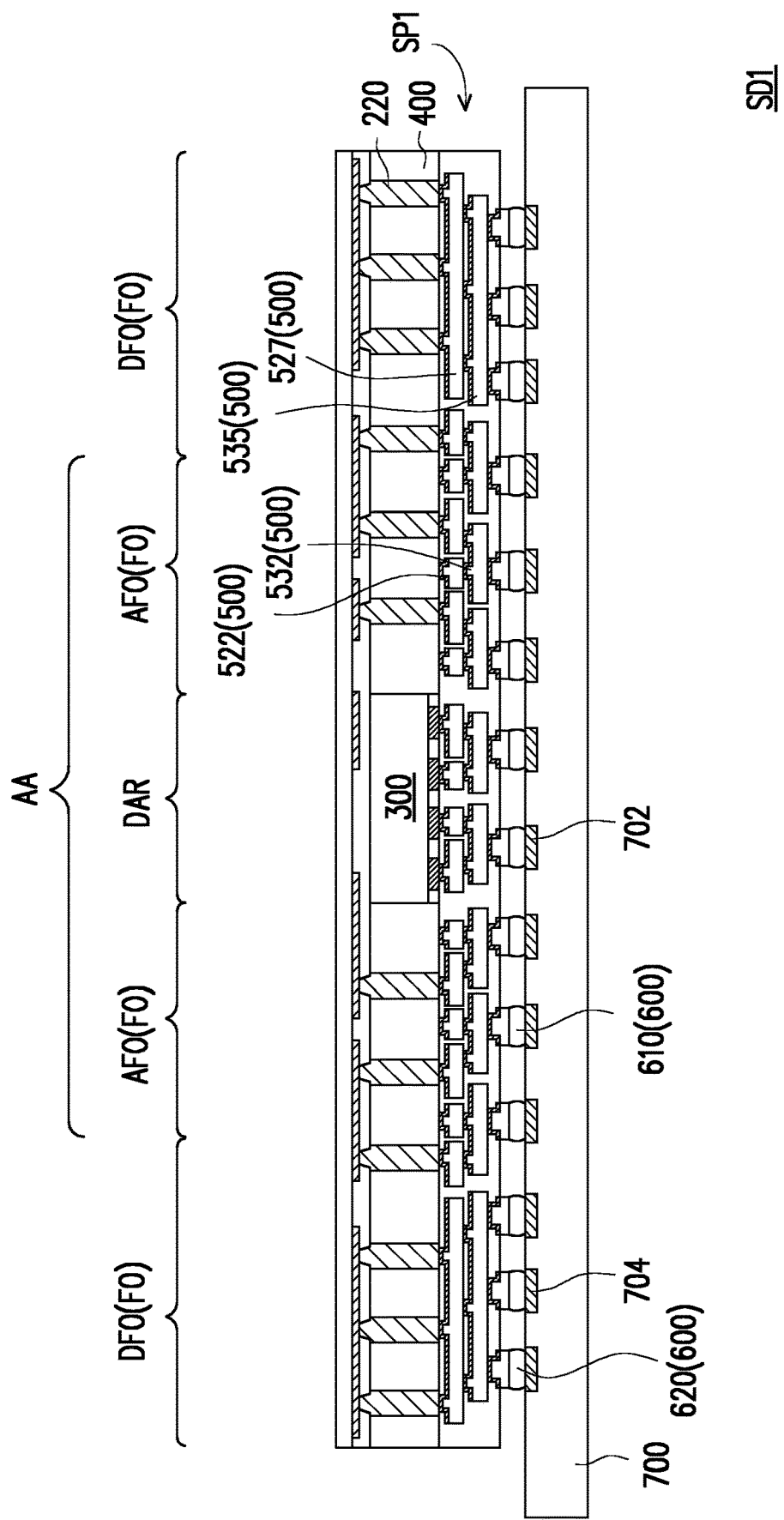
FIG. 9 is a schematic cross-sectional view of a semiconductor device in accordance with some embodiments of the disclosure.

In some embodiments, the semiconductor package SP1 may be integrated in a larger semiconductor device SD1, as illustrated in the cross-sectional view of FIG. 9. In some embodiments, the connective terminals 600 are connected to the conductive pads 702, 704 of a circuit carrier 700, such as a printed circuit board, a mother board, or the like. For example, the semiconductor package SP1 may be mounted on the circuit carrier 700 via a soldering process, a reflow process, or other processes requiring heating conditions. In some embodiments, the conductive pads 702, 704 include active conductive pads 702 and dummy conductive pads 704. The active connective terminals 610 are bonded to the active conductive pads 702, and the dummy connective terminals 620 are bonded to the dummy conductive pads 704. In some embodiments, the coefficient of thermal expansion of the circuit carrier 700 may be different from the coefficient of thermal expansion of the redistribution structure 500, or, in general, of the semiconductor package SP1. When the coefficients of thermal expansion mismatch, stress may be generated in correspondence of the connective terminals 600, which may be transmitted to the redistribution structure 500. In some embodiments, even if mechanical stress such as plastic strain or peeling stress is transmitted to the redistribution structure 500, because the redistribution structure 500 includes compliance structures such as the shielding plates 527, 535 and/or the anchor conductive vias 522, 532, the stress may be dissipated in larger areas (such as the shielding plates 527, 535, the dummy TIVs 220, and/or the encapsulant 400), and delamination or cracking of the redistribution structure 500 may be consequently reduced or eliminated. As such, manufacturing yield and reliability of the semiconductor device SD1 may be increased.

Figure 10:
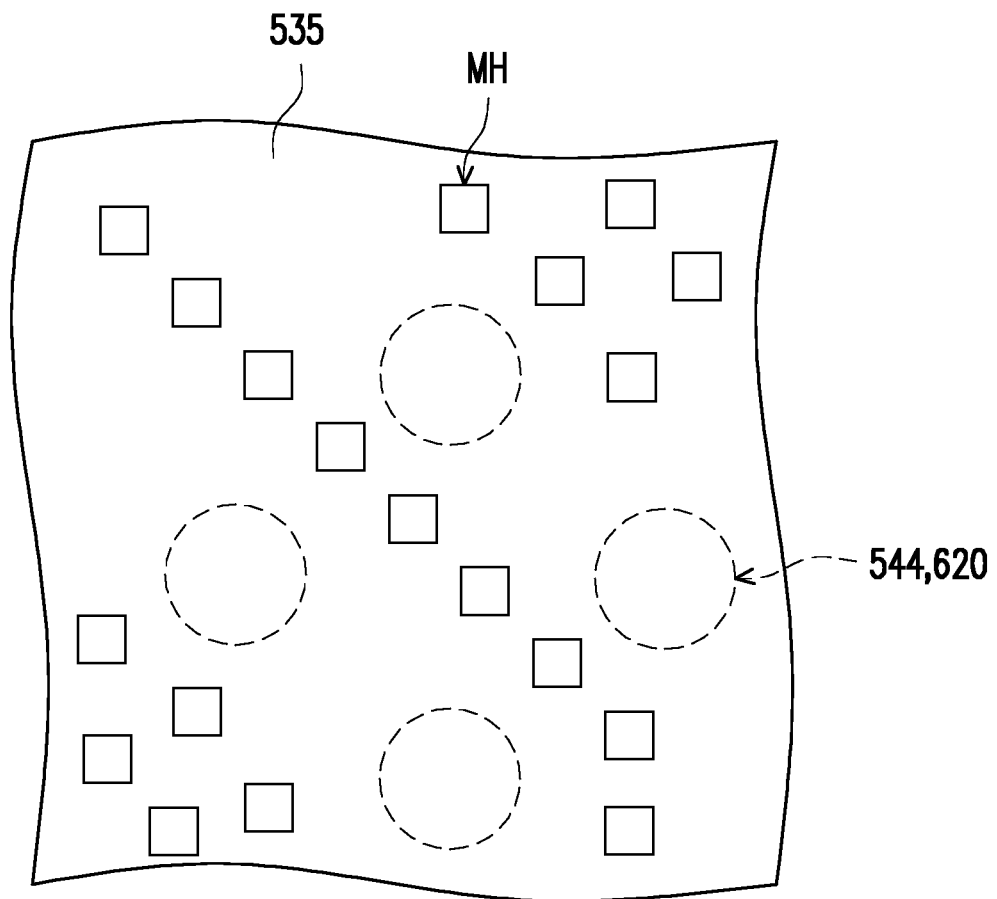
FIG. 10 is a schematic cross-sectional view illustrating a portion of a shielding plate in accordance with some embodiments of the disclosure.

FIG. 10 is a schematic cross-sectional view of a portion of the shielding plate 535 taken in the plane of the shielding plate 535 according to some embodiments of the disclosure. The dashed lines indicate the footprints of the bump supports 544 and the overlying dummy connective terminals 620, and may be considered as vertical projections of the two elements in the plane defined by the shielding plate 535. As illustrated in FIG. 10, the shielding plate 535 may include mesh holes MH formed therethrough. That is, the mesh holes MH may open in the shielding plate 535 and cross the shielding plate 535 from one side to the opposite side. In some embodiments, the mesh holes MH may be produced by patterning the patterned mask M2 (illustrated in FIG. 7B) so as to include isolated fragments of mask material (not shown) within the mask opening M05 (illustrated in FIG. 7B). After removal of the patterned mask M2 with its isolated fragments of mask material, the shielding plate 535 including the mesh holes MH is obtained. In some embodiments, the outermost dielectric layer 516 (illustrated in FIG. 8B) may fill the mesh holes MH. In some embodiments, the position of the mesh hole MH may be chosen when designing the circuit based on the space left over after the positions of the dummy connective terminals 620 and the dummy conductive vias 534 has been determined. In some embodiments, the mesh holes MH may further contribute to dissipate the mechanical stress received by the shielding plate 535. In some embodiments, the shielding plate 527 (illustrated, e.g., in FIG. 7B) may have a structure similar to the one just discussed for the shielding plate 535, with the position of the mesh holes MH being determined based on the position of the contacting dummy conductive vias 534 and 526, rather than the dummy connective terminals 620.

Figure 11:
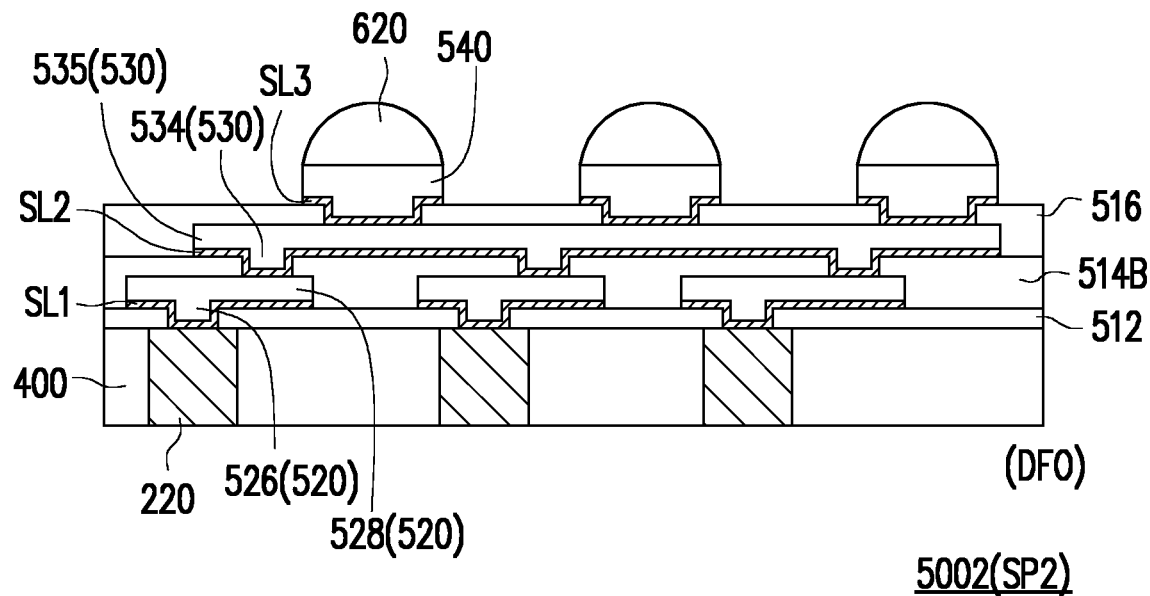
FIG. 11 and FIG. 12 are schematic cross-sectional view illustrating portions of semiconductor packages in accordance with some embodiments of the disclosure.

FIG. 11 is a schematic cross-sectional view of a portion of a semiconductor package SP2 according to some embodiments of the disclosure. The semiconductor package SP2 may be similar to the semiconductor package SP1 of FIG. 1E and FIG. 2B. FIG. 11 illustrates details of the redistribution structure 5002 and the dummy connective terminals 620 of the semiconductor package SP2. The area illustrated in FIG. 11 may correspond to the area A2 in the dummy fan-out region DFO illustrated in FIG. 1E. In the redistribution structure 5002, the upper metallization tier 530 includes the shielding plate 535 and the dummy conductive vias 534, similar to the semiconductor package SP1, while the lower metallization tier 520 does not include a shielding plate 527 (illustrated in FIG. 2B). Rather, the dummy conductive vias 534 are connected to a plurality of dummy conductive traces 528, which are further connected with the dummy conductive vias 526 in the lower metallization tier 520. In some embodiments, different dummy conductive vias 534 are connected to different dummy conductive traces 528. That is, in the redistribution structure 5002, the shielding plates (e.g., 535) are included in the upper metallization tier 530 but not in the lower metallization tier 520. The dummy conductive traces 528 may be separated from each other by the intermediate dielectric layer 514B. In some embodiments, part of the mechanical stress may still be routed to the dummy TIVs 220 via the dummy conductive vias 526, 534 and the dummy conductive traces 528.

Figure 12:
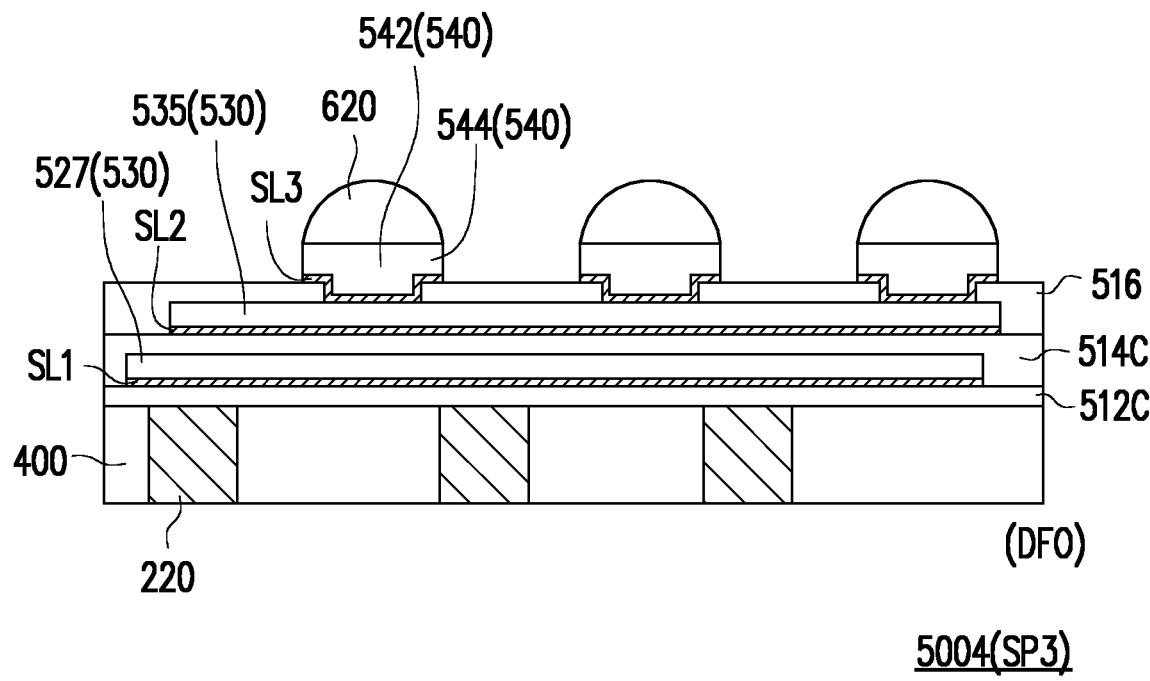

FIG. 12 is a schematic cross-sectional view of a portion of a semiconductor package SP3 according to some embodiments of the disclosure. The semiconductor package SP3 may be similar to the semiconductor package SP1 of FIG. 1E and FIG. 2B. FIG. 12 illustrates details of the redistribution structure 5004 and the dummy connective terminals 620 of the semiconductor package SP2. The area illustrated in FIG. 12 may correspond to the area A2 in the dummy fan-out region DFO illustrated in FIG. 1E. In the redistribution structure 5004, the upper metallization tier 530 includes the shielding plate 535 and the lower metallization tier 520 includes the shielding plate 527. However, in the redistribution structure 5004 there are no dummy conductive vias connecting the shielding plate 535 to the shielding plate 537. Rather, the two shielding plates 535, 527 extend parallel to each other in different metallization tiers 520, 530 of the redistribution structure 5004, separated by the intermediate dielectric layer 514C. Furthermore, no dummy conductive vias are formed in the lower metallization tier 520 connecting the shielding plate 527 with the dummy TIVs 220. In some embodiments, the shielding plate 527 is sandwiched and insulated by the innermost dielectric layer 512C and the intermediate dielectric layer 514. The shielding plate 535 of the upper metallization tier 530 is instead connected to the under-bump metallurgies 540 and the dummy connective terminals 620. In some embodiments, the shielding plate 535 may effectively dissipate the mechanical stress generated at the dummy connective terminals 620, while the shielding plate 527 may provide additional structural support to the redistribution structure 5004.

Figure 13A:
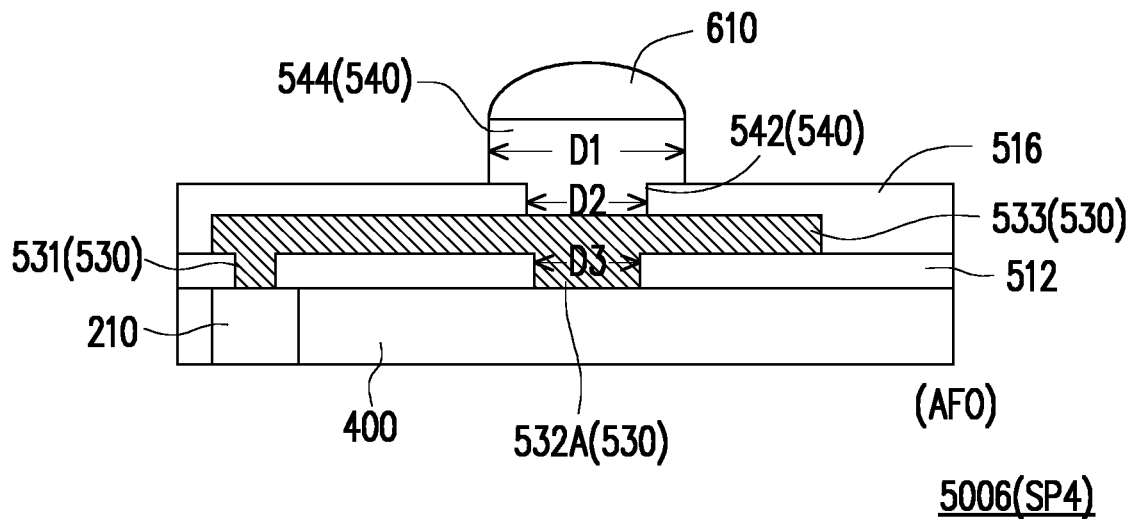
FIG. 13A and FIG. 13B are schematic cross-sectional views illustrating portions of a semiconductor package in accordance with some embodiments of the disclosure.
Figure 13B:
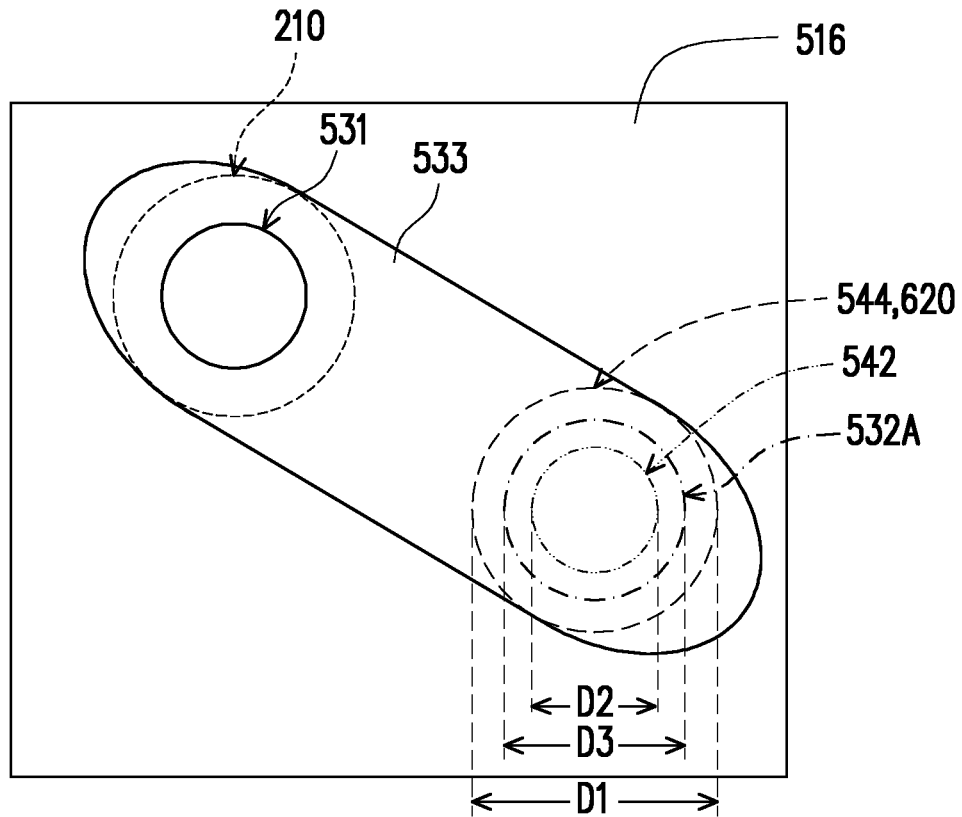

FIG. 13A is a schematic cross-sectional view of a portion of a semiconductor package SP4 according to some embodiments of the disclosure. FIG. 13B is a schematic cross-sectional view of the portion of semiconductor package SP4 taken in the plane of the routing conductive trace 533. The semiconductor package SP4 may be similar to the semiconductor package SP1 of FIG. 1E and FIG. 2A. FIG. 13A and FIG. 13B illustrate details of the redistribution structure 5006 and the active connective terminals 610 of the semiconductor package SP4. The area illustrated in FIG. 13A and FIG. 13B may correspond to the area A1 in the active fan-out region AFO illustrated in FIG. 1E. In some embodiments, the redistribution structure 5006 includes a single metallization tier 530, and two dielectric layers 512 and 516 sandwiching the metallization tier 530. The metallization tier 530 includes active conductive vias 531, anchor conductive vias 532A, and routing conductive traces 533. The active conductive vias 531 and the anchor conductive vias 532A are embedded in the innermost dielectric layer 512. The routing conductive traces 533 extend on the innermost dielectric layer 512 and contact both the active conductive vias 531 and the anchor conductive vias 532A. The active conductive vias 531 connect the routing conductive traces 533 to the active TIVs 210, while the anchor conductive vias 532A are disposed on the encapsulant 400. The under-bump metallurgies 540 having the active conductive terminals 610 formed thereon are disposed on the routing conductive trace 533, vertically stacked with respect to the anchor conductive vias 532A. The under-bump conductive vias 542 are embedded in the outermost dielectric layer 516 and the bump supports 544 extend on the under-bump conductive vias 542 and the outermost dielectric layer 516. In FIG. 13B are illustrated a portion of the outermost dielectric layer 516 and a routing conductive trace 533. The circles represented with lines of different styles correspond to the footprints of the corresponding labelled elements connected to the illustrated routing conductive trace 533 in the plane where the routing conductive trace 533 lies. The solid circle corresponds to the footprint of an active conductive via 531, the small-dashed circle to the footprint of an active TIV 210, the dashed circle to the footprints of a bump support 544 and an active connective terminal 610, the dash-dotted circle to the footprint of an anchor conductive via 532A, and the dash-double-dotted circle to the footprint of an under-bump conductive via 542. As illustrated in FIG. 13B, the footprints of the active TIVs 210, the conductive vias 531, 532A, 542, the under-bump support 544 and the active connective terminal 610 are all substantially circular, however the disclosure is not limited thereto. In some alternative embodiments, the footprints may have different shapes, e.g., elliptical, polygonal, and so on. Furthermore, the footprints of different elements are not limited to have the same shape. For example, the anchor conductive via 532A may have a square footprint, while the overlying under-bump metallurgy 540 may have a circular footprint. While the following discussion will focus on an embodiment in which all footprints are substantially circular, the disclosure is not limited thereto, and other combinations of shapes are also contemplated. In some embodiments, a footprint of the bump support 544 may have a larger area than the footprints of the under-bump conductive via 542 and the anchor conductive via 532A. Furthermore, the footprint of the under-bump conductive via 542 may be substantially equal to the footprint of the anchor conductive via 532A. In some embodiments, when the footprints are circular, a diameter D1 of the bump support 544 may be in the range from 28 micrometers to 112 micrometers, a diameter D2 of the under-bump conductive via 542 may be in the range from 13 micrometers to 50 micrometers, and a diameter D3 of the anchor conductive via 532A may be in the range from 13 micrometers to 62 micrometers.

Figure 14A:
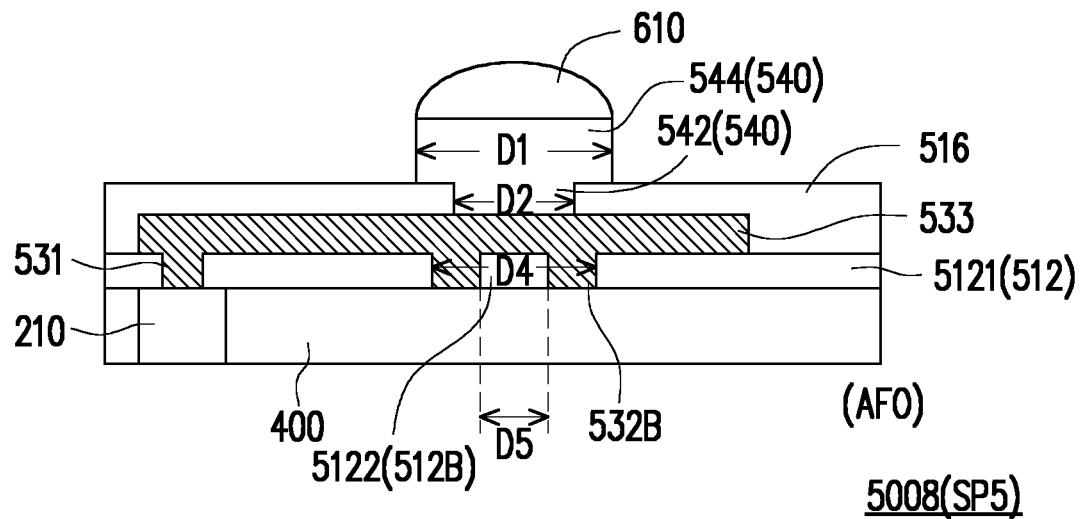
FIG. 14A and FIG. 14B are schematic cross-sectional views illustrating portions of a semiconductor package in accordance with some embodiments of the disclosure.
Figure 14B:
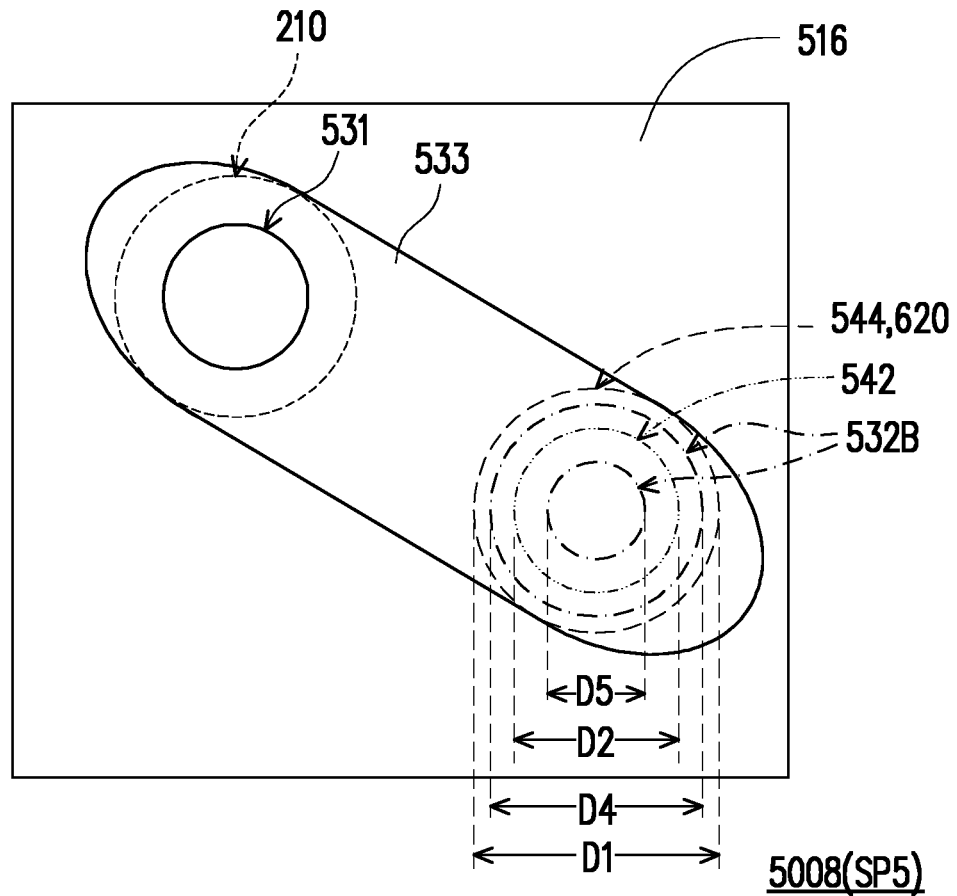

FIG. 14A is a schematic cross-sectional view of a portion of a semiconductor package SP5 according to some embodiments of the disclosure. FIG. 14B is a schematic cross-sectional view of the portion of semiconductor package SP5 illustrated in FIG. 14A taken in the plane of the routing conductive trace 533. The semiconductor package SP5 may be similar to the semiconductor package SP4 of FIG. 13A and FIG. 13B. FIG. 14A and FIG. 14B illustrate details of the redistribution structure 5008 and the active connective terminals 610 in the active fan-out region AFO of the semiconductor package SP5. The views illustrated in FIG. 14A and FIG. 14B for the semiconductor package SP5 may correspond to the views illustrated in FIG. 13A and FIG. 13B for the semiconductor package SP4. In some embodiments, a difference between the redistribution structure 5006 of FIG. 13A and the redistribution structure 5008 of FIG. 14A lies in the shape of the anchor conductive via 532B. In some embodiments, the anchor conductive via 532B has a (circular) ring shape (a donut shape). The innermost dielectric layer 512B includes a portion 5121 extending outside (encircling) the anchor conductive via 532B, similar to the innermost dielectric layer 512 with respect to the anchor conductive via 532A of FIG. 13A and FIG. 13B. The innermost dielectric layer 512B further includes a portion 5122 filling the space at the center of the ring (the hole of the donut). That is, the anchor conductive via 532B may encircle the portion 5122 of the innermost dielectric layer 512B. In some embodiments, an outer diameter D4 of the anchor conductive via may be in the range from 13 micrometers to 112 micrometers, and the inner diameter D5 (corresponding also to the diameter of the portion 5122 of innermost dielectric layer 512B) may be up to 96% of the outer diameter.

Figure 15:
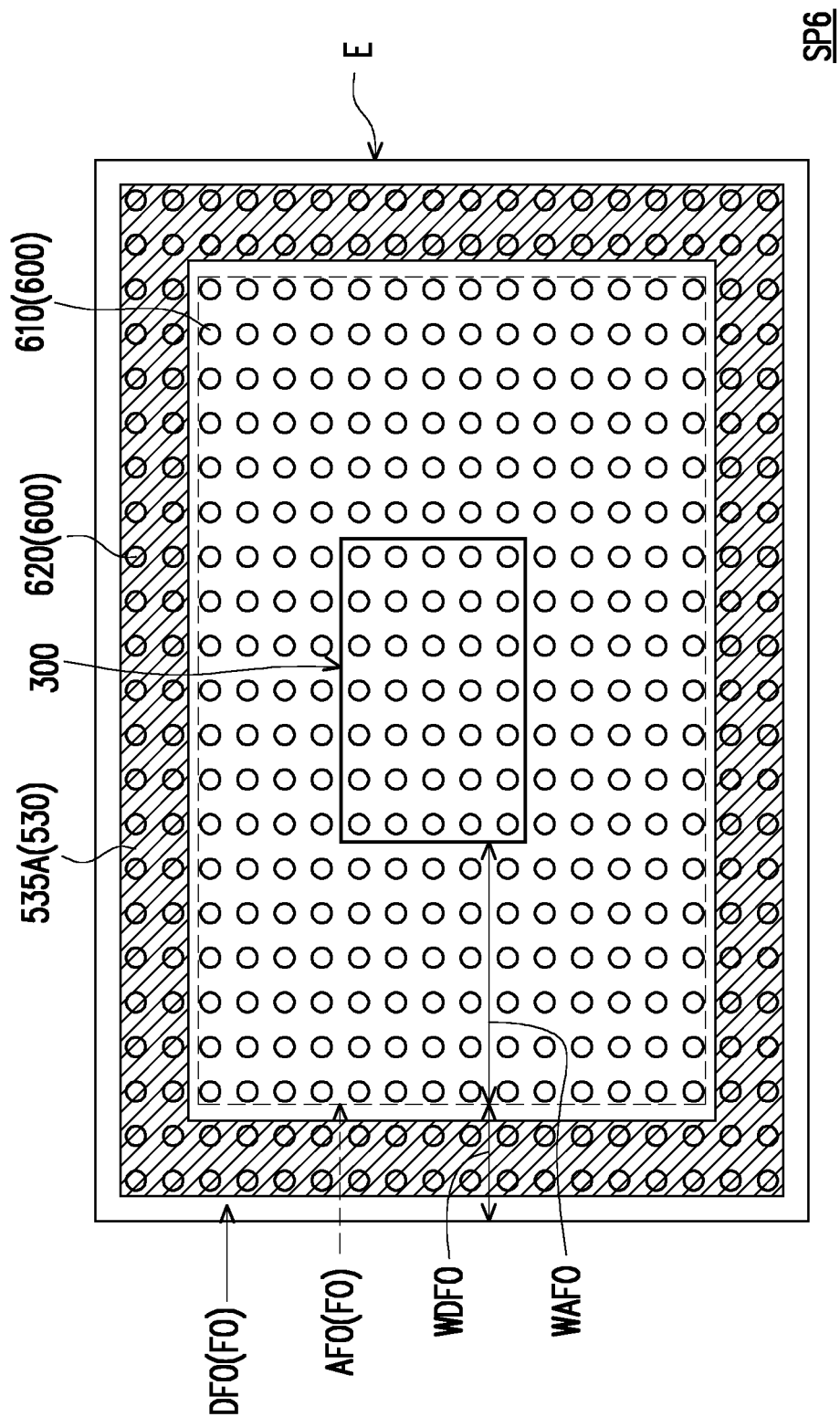
FIG. 15 through FIG. 18 are schematic top views illustrating semiconductor packages in accordance with some embodiments of the disclosure.

FIG. 15 is a schematic top view of a semiconductor package SP6 according to some embodiments of the disclosure. The semiconductor package SP6 may be similar to the semiconductor package SP1 of FIG. 1E. In the top view of FIG. 15 are illustrated the footprint of the semiconductor die 300, the position of the connective terminals 600, and the footprint of the shielding plate 535A. The dotted line indicates the boundary between the active fan-out region AFO and the dummy fan-out region DFO. In some embodiments, the fan-out region FO of the semiconductor package SP6 extends from the periphery of the semiconductor die 300 to the edge E of the semiconductor package SP6. The fan-out region FO includes the dummy fan-out region DFO and the active fan-out region AFO. In the semiconductor package SP6, the dummy fan-out region DFO and the active fan-out region AFO are concentrically disposed with respect to the semiconductor die 300. In some embodiments, the active fan-out region AFO has an annular shape encircling the semiconductor die 300, and the dummy fan-out region DFO has an annular shape encircling the active fan-out region AFO. In some embodiments, the dummy fan-out region DFO is considered the area from the edge E of the semiconductor package SP to the outermost ring of active connective terminals 610, and the active fan-out region AFO is considered the region from the border of the dummy fan-out region DFO to the periphery of the semiconductor die 300. In some embodiments, the width WDFO of the dummy fan-out region DFO is considered as the distance from the edge E of the semiconductor package SP6 to the outermost ring of active connective terminals 610, and is at least 2% of the total width of the fan-out region FO. The total width of the fan-out region FO may be considered as the sum of the width WDFO of the dummy fan-out region DFO, and the width WAFO of the active fan-out region AFO, where the width WAFO of the active fan-out region AFO is considered as the distance from the outermost ring of active connective terminals 610 to the semiconductor die 300. As illustrated in FIG. 15, in the semiconductor package SP6 a single shielding plate 535A is included in the upper metallization tier 530. The shielding plate 535A has an annular shape, and extends throughout the dummy fan-out region DFO. In some embodiments, the dummy connective terminals 620 are connected to the shielding plate 535A, and their vertical projections fall on the shielding plate 535A. In some embodiments, the shielding plate 535A underlies both the dummy connective terminals 620 closer to the semiconductor die 300 and the dummy connective terminals 620 closer to the edge E of the semiconductor package SP6. In some embodiments, a redistribution structure including the shielding plate 535A of the semiconductor package SP6 may or may not include lower metallization tiers (not shown), and, if included, the lower metallization tiers may or may not include additional shielding plates (not shown), according to the structures previously discussed.

Figure 16:
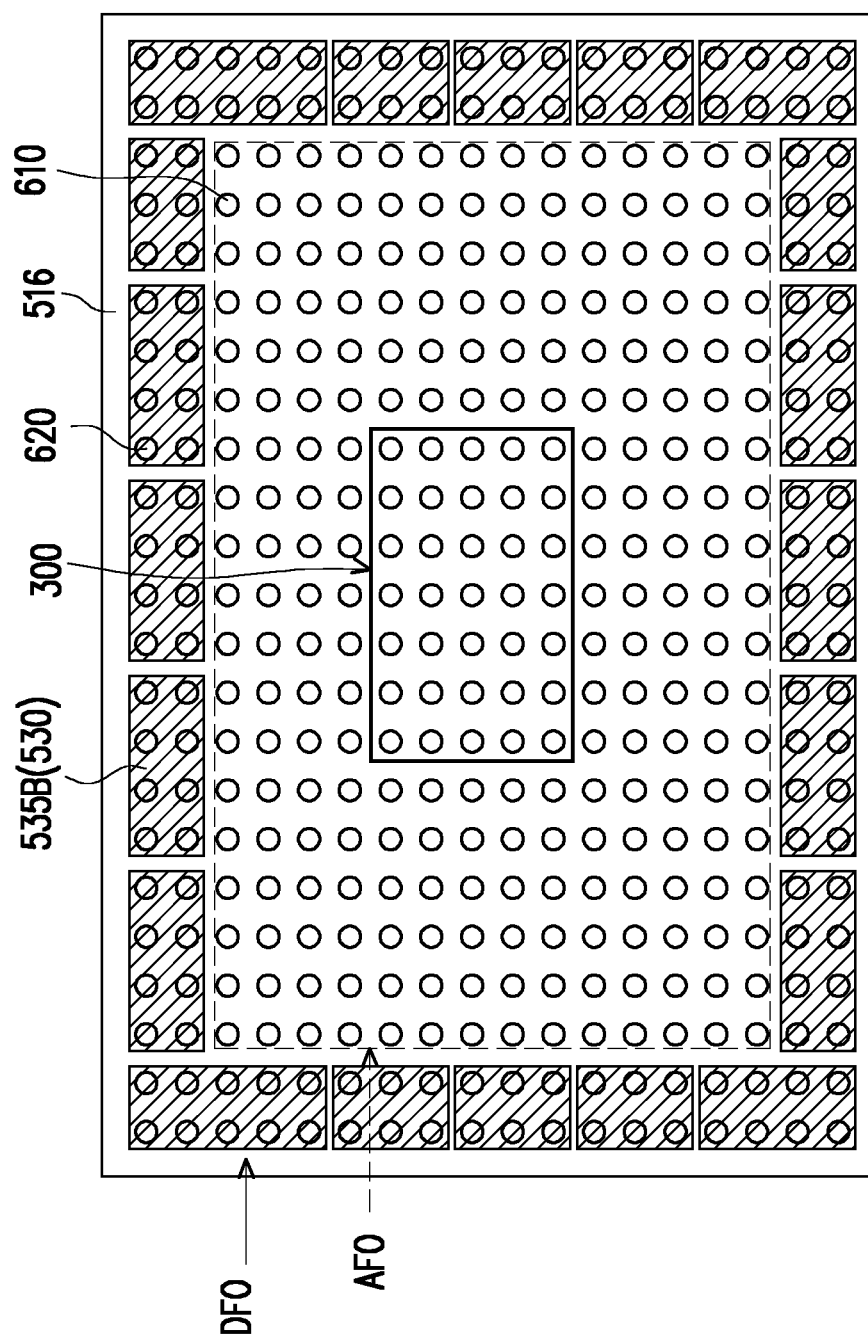

FIG. 16 is a schematic top view of a semiconductor package SP7 according to some embodiments of the disclosure. The semiconductor package SP7 may be similar to the semiconductor package SP6 of FIG. 15. In some embodiments, the upper metallization tier 530 of the semiconductor package SP7 includes multiple shielding plates 535B spanning throughout the dummy fan-out region DFO. The shielding plates 535B may be disconnected from each other, and each shielding plate 535B may be connected to some of the dummy connective terminals 620. That is, different groups of dummy connective terminals 620 may be connected to different shielding plates 535B. The multiple shielding plates 535B may be separated from each other by the outermost dielectric layer 516. Lower metallization tiers (if included) may also include multiple shielding plates as illustrated for the upper metallization tier 530.

Figure 17:
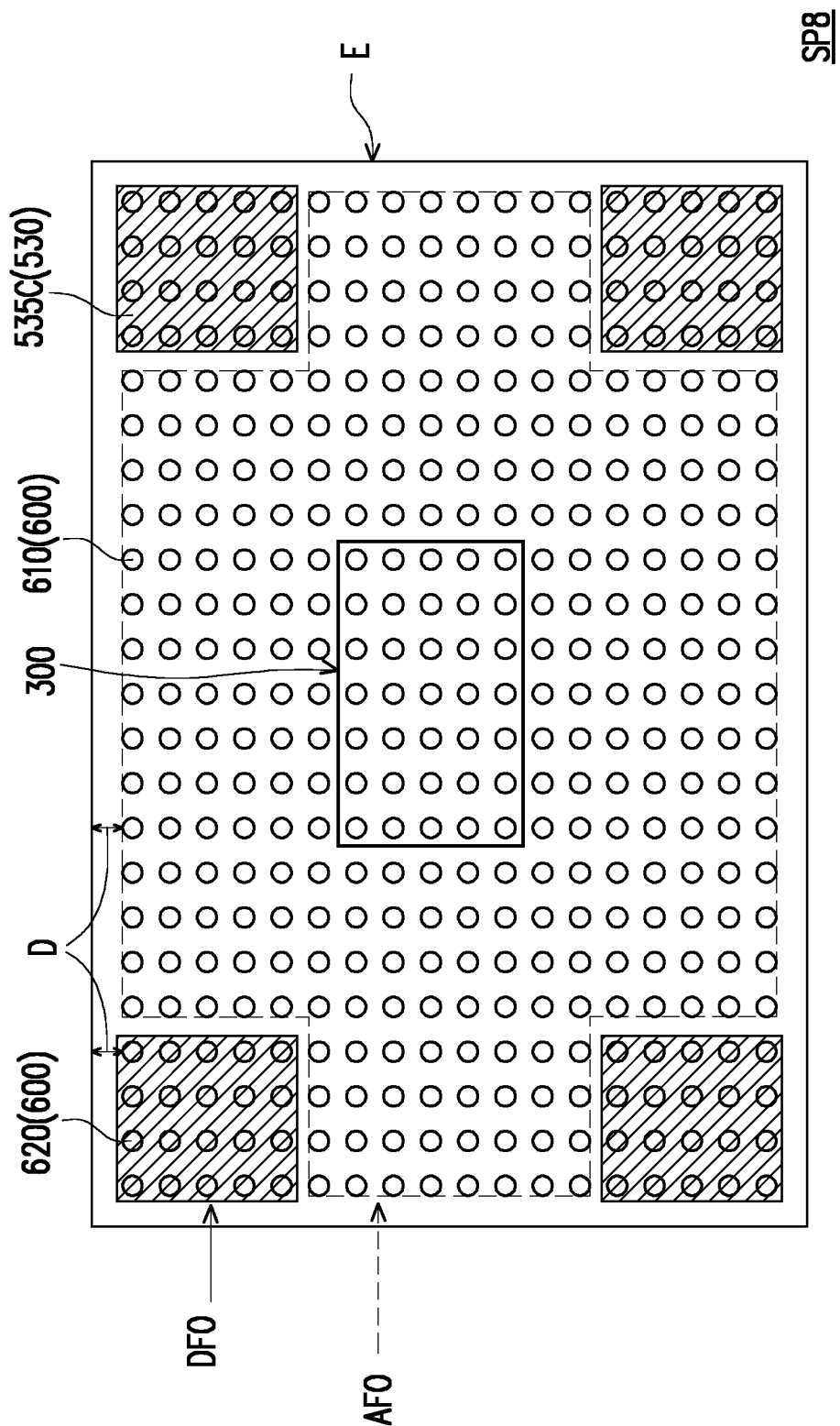

FIG. 17 is a schematic top view of a semiconductor package SP8 according to some embodiments of the disclosure. The semiconductor package SP8 may be similar to the semiconductor package SP7 of FIG. 16. In some embodiments, the upper metallization tier 530 of the semiconductor package SP8 includes four shielding plates 535C disposed at the corners of the semiconductor package SP8. The shielding plates 535C may be disconnected from each other, and each shielding plate 535C may be connected to some of the dummy connective terminals 620 disposed at the corresponding corner of the semiconductor package SP8. In some embodiments, the active fan-out region AFO may extend in between the shielding plates 535C. As illustrated in FIG. 17, the active fan-out region AFO may have the shape of a cross, with the four arms encountering in correspondence of the semiconductor die 300. In some embodiments, some of the active connective terminals 610 may be equally distant from the edge E of the semiconductor package SP8 as some of the dummy connective terminals 620. That is, the connective terminals 600 included in the outermost ring of connective terminals 600 may be at the same distance D from the edge E of the semiconductor the a dummy connective terminal 620 of the outermost ring of connective terminals 600 may be at the same distance D from the edge E of the semiconductor package SP8 along a side of the semiconductor package SP8, and the outermost ring of connective terminals 600 may include both active connective terminals 610 and dummy connective terminals 620.

Figure 18:
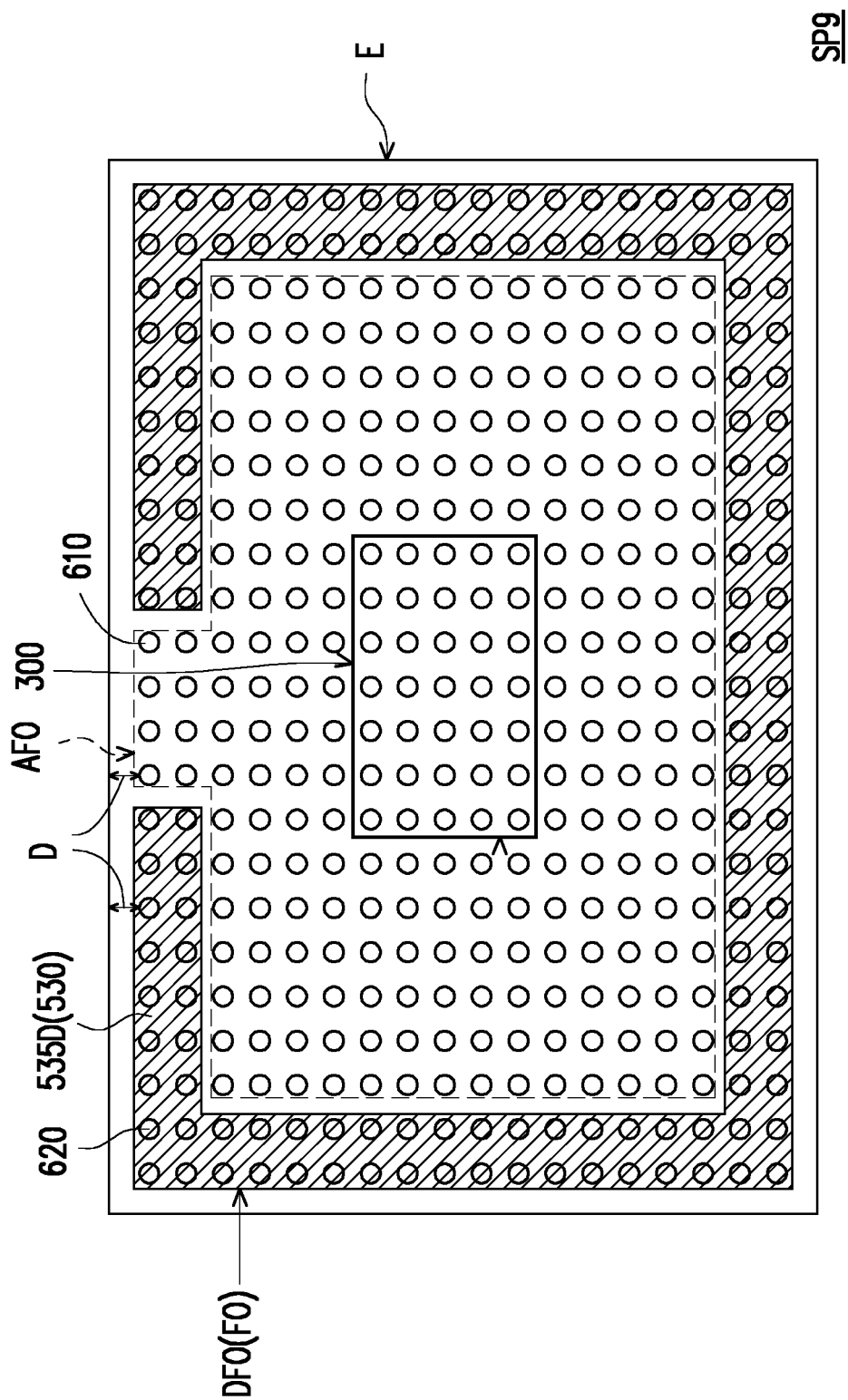

FIG. 18 is a schematic top view of a semiconductor package SP9 according to some embodiments of the disclosure. The semiconductor package SP9 may be similar to the semiconductor package SP6 of FIG. 15. In some embodiments, the dummy fan-out region DFO of the semiconductor package SP9 has an open annular shape. The active fan-out region AFO may protrude in the gap of the dummy fan-out region DFO to extend towards the edge E of the semiconductor package. That is, also in the semiconductor package SP9 there may be some active connective terminals 610 which are equidistant from the peripheral edge E of the semiconductor package SP9 as the dummy connective terminals 620, similar to what was previously described for the semiconductor package SP8 of FIG. 17. In some embodiments, the upper metallization tier 530 of the semiconductor package SP9 includes a single shielding plate 535D having an open annular shape, to which the dummy connective terminals 620 are connected. In some embodiments, the active fan-out region AFO may extend within the opening of the shielding plate 535D.

Figure 19:
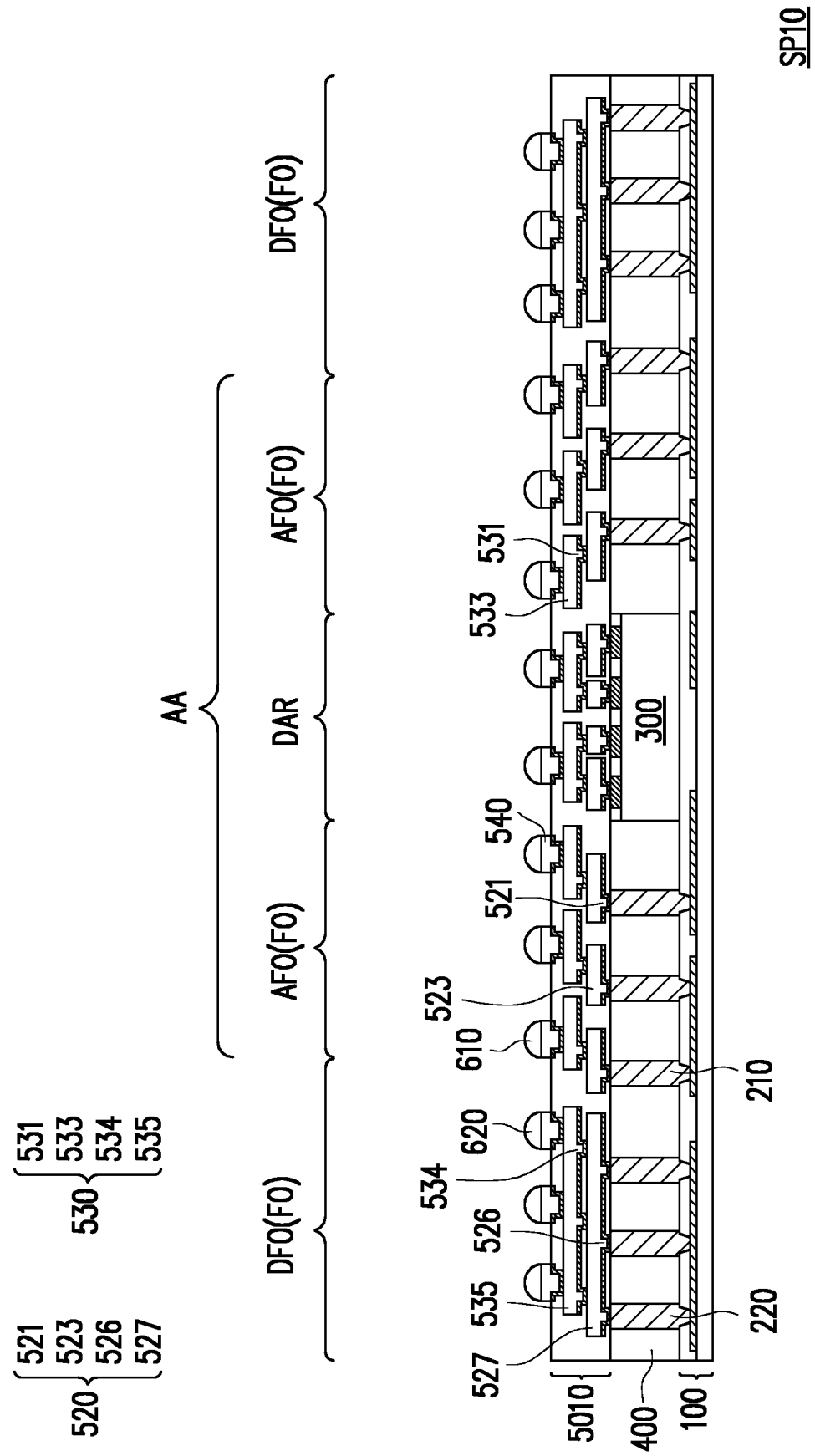
FIG. 19 through FIG. 21 are schematic cross-sectional views illustrating semiconductor packages in accordance with some embodiments of the disclosure.

FIG. 19 is a schematic cross-sectional view of a semiconductor package SP10 according to some embodiments of the disclosure. The semiconductor package SP10 may be similar to the semiconductor package SP1 of FIG. 1E. In some embodiments, a difference between the semiconductor package SP10 and the semiconductor package SP1 lies in the lack of anchor conductive vias and anchor conductive traces. That is, the redistribution structure 5010 of the semiconductor package SP10 includes the shielding plates 527 and 535 as compliance structures for the mechanical stress generated at the dummy connective terminals 620, while the active connective terminals 610 are not connected to anchor conductive vias. For example, the lower metallization tier 520 may include the active conductive vias 521, the routing conductive traces 523, the dummy conductive vias 526 and the shielding plate 527, but no anchor conductive vias or anchor conductive traces. Similarly, the upper metallization tier 530 may include the active conductive vias 531, the routing conductive traces 533, the dummy conductive vias 534 and the shielding plate 535, but no anchor conductive vias. The routing conductive traces 533 may only be connected to under-bump metallurgies 540 or active conductive vias 531. In some embodiments, the mechanical stress may be generated mostly in the dummy fan-out region DFO, and, as such, the shielding plates 527, 535 may sufficiently enhance the reliability of the semiconductor package SP10 without need of additional compliance structures.

Figure 20:
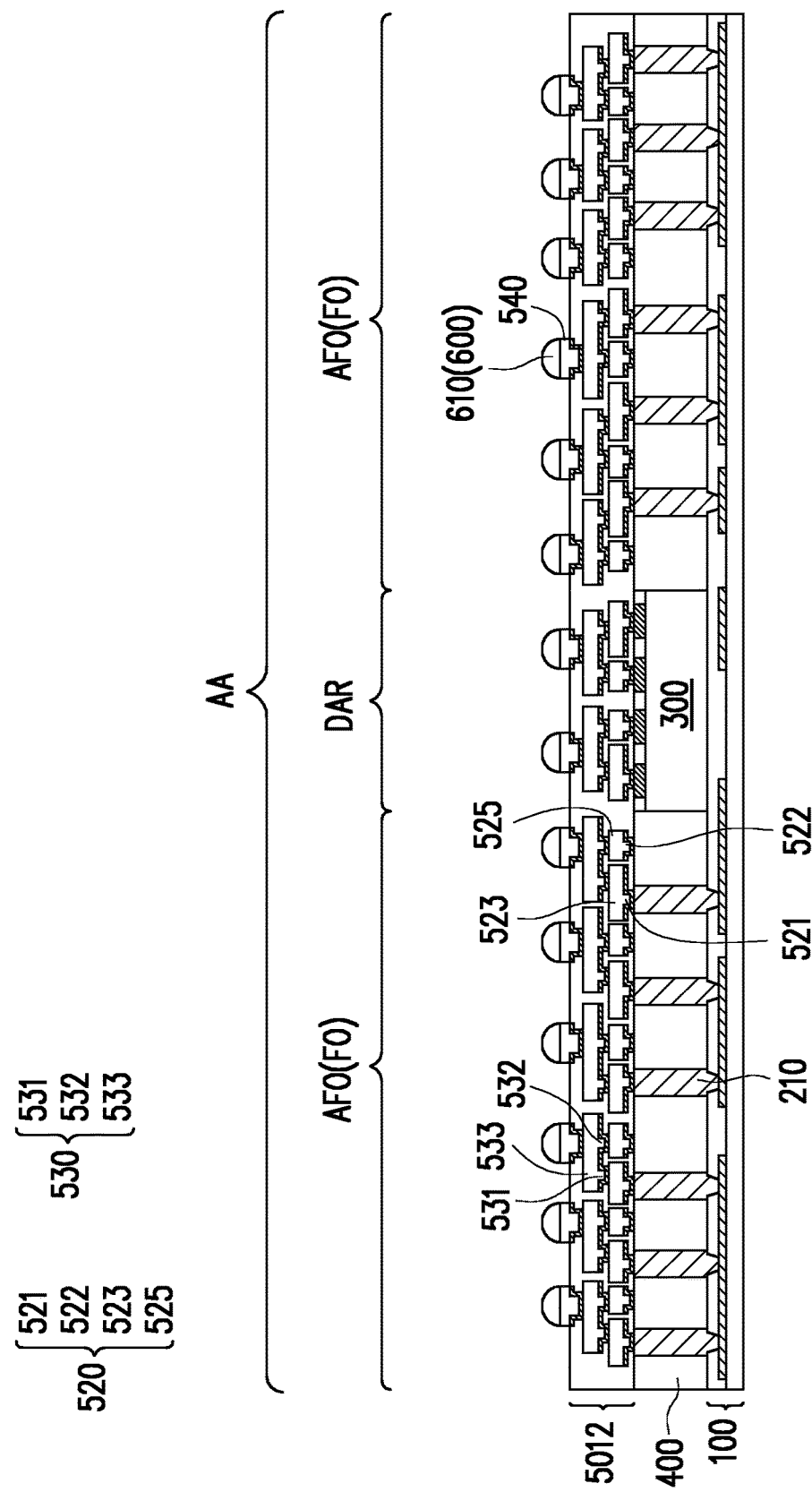

FIG. 20 is a schematic cross-sectional view of a semiconductor package SP11 according to some embodiments of the disclosure. The semiconductor package SP11 may be similar to the semiconductor package SP1 of FIG. 1E. In some embodiments, a difference between the semiconductor package SP11 and the semiconductor package SP1 lies in the lack of shielding plates in the metallization tiers 520, 530 of the redistribution structure 5012. That is, the metallization tiers 520, 530 only include active conductive vias 521, 531, routing conductive traces 523, 533, anchor conductive vias 522, 532, and anchor conductive traces 525. In some embodiments, the semiconductor package does not include a dummy fan-out region DFO. That is, the active area AA of the semiconductor package SP11 may substantially extend throughout the entire semiconductor package SP11. In some embodiments, all the connective terminals 600 are active connective terminals 610. However, the disclosure is not limited thereto. In some alternative embodiments, dummy connective terminals may also be mechanically connected to the encapsulant 400 by anchor conductive vias and anchor conductive traces, without being connected to shielding plates. This may be the case, for example, when formation of the shielding plates may conflict with other circuit design requirements. That is, coupling of the dummy connective terminals to the encapsulant 400 via anchor conductive vias 532 may provide a stress dissipation mechanism alternative to the shielding plates for the dummy conductive terminals.

Figure 21:
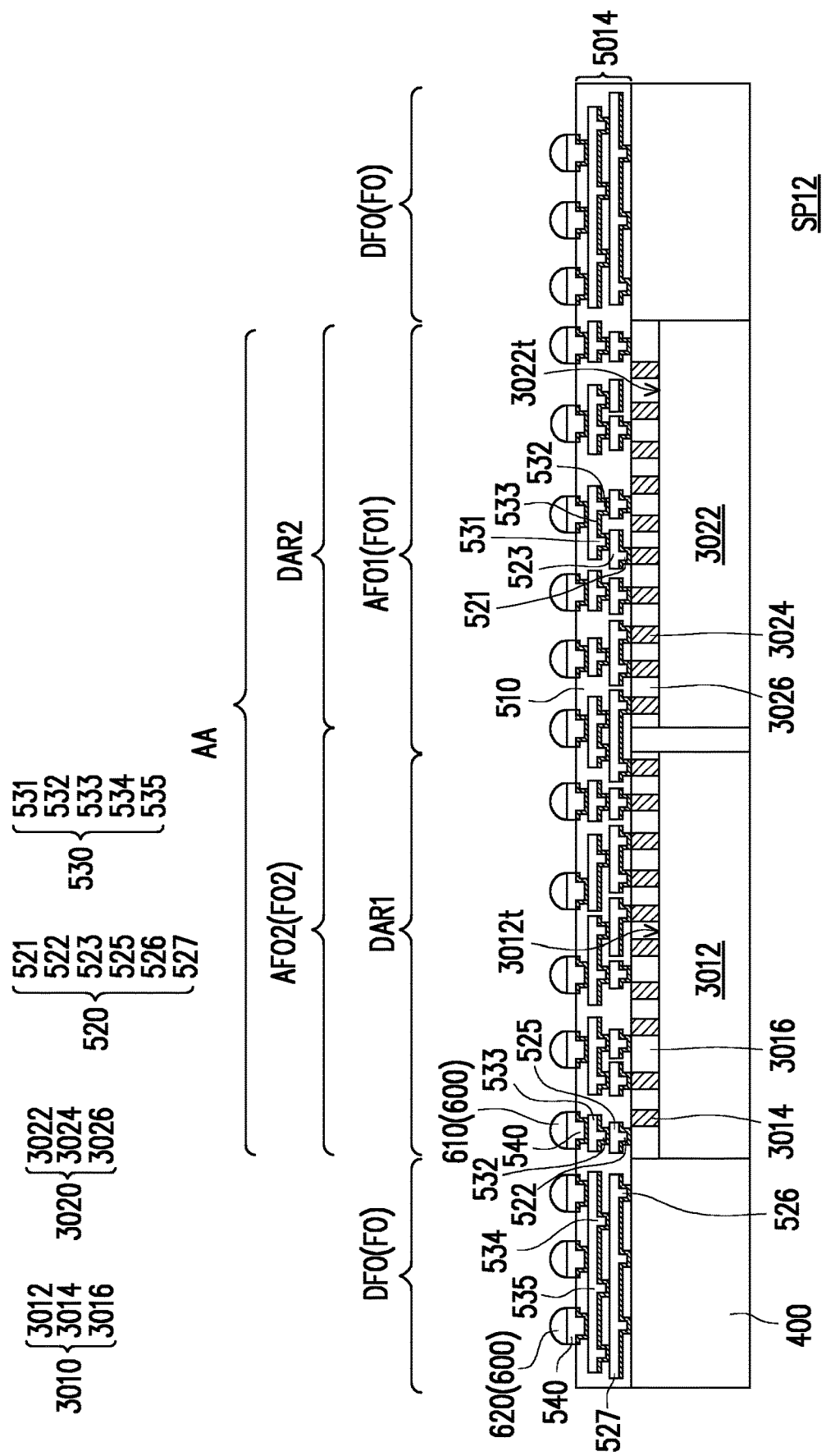

FIG. 21 is a schematic cross-sectional view of a semiconductor package SP12 according to some embodiments of the disclosure. The semiconductor package SP12 may be similar to the semiconductor package SP1 of FIG. 1E. In some embodiments, the semiconductor package SP12 includes multiple semiconductor dies 3010, 3020 disposed side-by-side and encapsulated by the encapsulant 400. Each one of the semiconductor dies 3010, 3020 includes a semiconductor substrate 3012, 3022, contact pads/posts 3014, 3024, and a passivation layer 3016, 3026. The contact pads 3014, 3024 are respectively formed at the top surfaces 3012$t$, 3022$t$ of the semiconductor substrates 3012, 3022, and are laterally surrounded by the passivation layers 3016, 3026. The redistribution structure 5014 extends over the encapsulant 400 and the semiconductor dies 3010, 3020. As illustrated in FIG. 21, the redistribution structure 5014 includes two metallization tiers 520, 530 embedded in the dielectric layer 510. The metallization tiers 520, 530 interconnect the semiconductor dies 3010, 3020 of the semiconductor package SP12, and further connect the semiconductor dies 3010, 3020 to the connective terminals 600. However, the disclosure is not limited by the number of metallization tiers included in the redistribution structure 5014. In some embodiments, the semiconductor package SP12 includes an active area AA in which the semiconductor dies 3010, 3020 are located, and a dummy fan-out region DFO surrounding the active area AA in which the dummy connective terminals 620 are located. In some embodiments, the active area AA may be divided in a die attach region DAR and an active fan-out region AFO with respect to each semiconductor die 3010, 3020. For example, the area where the semiconductor die 3010 is located may be defined as a die attach region DAR1, and the remaining part of the active area AA may be considered an active fan-out region AFO1 for the semiconductor die 3010. Similarly, the area where the semiconductor die 3020 is located may be defined as a die attach region DAR2, and the remaining part of the active area AA may be considered as an active fan-out region AFO2 for the semiconductor die 3020. Similar to the description provided with respect to FIG. 15, the active area AA may be considered the area defined by the outermost active connective terminals 610 (the active connective terminals 610 closer to the edge of the semiconductor package SP12). As illustrated in FIG. 21, in some embodiments the outermost active connective terminals 610 may fall within the spans of the semiconductor dies 3030, 3040 in one of the die attach regions DAR1, DAR2. In such cases, the dummy fan-out region DFO extends from the edge of the semiconductor package SP12 to the borders of the die attach regions DAR1, DAR2.

In some embodiments, the first metallization tier 520 of the redistribution structure 5014 includes the active conductive vias 521 which are directly connected to (in physical contact with) the contact pads 3014, 3024 of the semiconductor dies 3010, 3020 on one side, and to the routing conductive traces 523 at the other side. The routing conductive traces 523 are connected to the active connective terminals 610 by the active conductive vias 531 and the routing conductive traces 533 of the metallization tier 530. Some of the routing conductive traces 523 may further be physically connected to an anchor conductive via 522. The anchor conductive vias 522 may be in physical contact with the routing conductive traces 523 or the anchor conductive traces 525 on one side, and may be in physical contact with the passivation layer 3016, 3026 on the opposite side. In some embodiments, the anchor conductive vias 522 receive the stress generated at the active connective terminals 610 through the anchor conductive traces 525, the anchor conductive vias 322, and the routing conductive traces 533. That is, in the semiconductor package SP12, the stress generated at the active connective terminals 610 may be transmitted through the anchor conductive vias 522 to the passivation layers 3016, 3026 of the semiconductor dies 3010, 3020. However, the disclosure is not limited thereto, and some of the anchor conductive vias 522 may also be connected to the encapsulant 400, depending on the relative position of the connective terminals 600 and the semiconductor dies 3010, 3020.

In some embodiments, the redistribution structure 5014 further includes the shielding plates 527, 535 located in the dummy fan-out region DFO, and receiving the stress generated at the dummy connective terminals 620. The shielding plates 527, 535 may be connected with each other by the dummy conductive vias 534, and may be connected to the encapsulant 400 by the dummy conductive vias 526. That is, in the semiconductor package SP12, the dummy conductive vias 526 may be connected to the encapsulant 400 rather than to TIVs (e.g., the TIV 220 illustrated in FIG. 1E).

Figure 22:
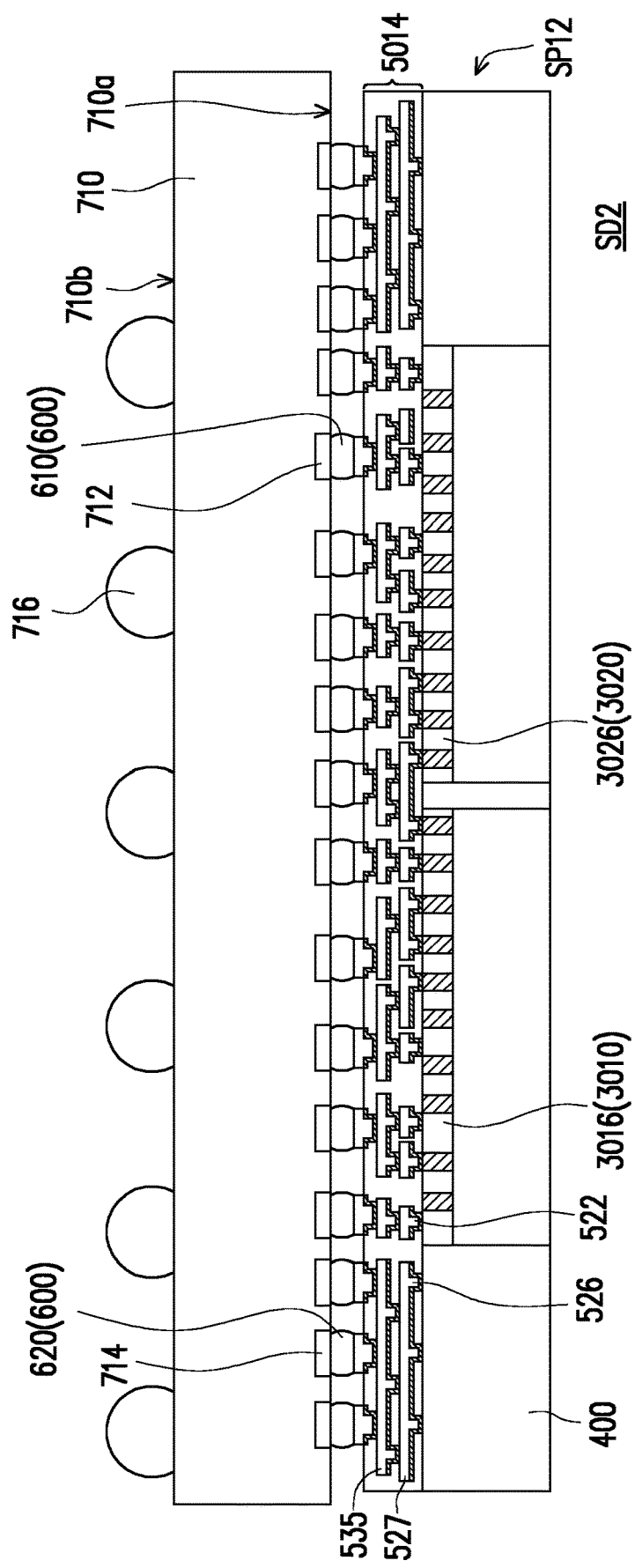
FIG. 22 is a schematic cross-sectional view illustrating a semiconductor device in accordance with some embodiments of the disclosure.

In some embodiments, the semiconductor package SP12 may be integrated in a larger semiconductor device SD2, as illustrated in the cross-sectional view of FIG. 22. In some embodiments, the connective terminals 600 are connected to the conductive pads 712, 714 of a circuit carrier 710, such as a printed circuit board, an interposer, a mother board, or the like. For example, the semiconductor package SP12 may be mounted on the circuit carrier 710 via a soldering process, a reflow process, or other processes requiring heating conditions. In some embodiments, the conductive pads 712, 714 include active conductive pads 712 and dummy conductive pads 714. The active connective terminals 610 are bonded to the active conductive pads 712, and the dummy connective terminals 620 are bonded to the dummy conductive pads 714. In some embodiments, the semiconductor package SP12 is disposed at a first side 710$a$ of the circuit carrier 710. The circuit carrier 710 may further include connectors 716 disposed at a second side 710$b$ opposite to the first side 710$a$ for further integration with other devices (not shown). In some embodiments, the coefficient of thermal expansion of the circuit carrier 710 may be different from the coefficient of thermal expansion of the redistribution structure 5014, or, in general, of the semiconductor package SP12. When the coefficients of thermal expansion mismatch, stress may be generated in correspondence of the connective terminals 600, which may be transmitted to the redistribution structure 5014. In some embodiments, even if mechanical stress such as plastic strain or peeling stress is transmitted to the redistribution structure 5014, because the redistribution structure 5014 includes compliance structures such as the shielding plates 527, 535 and/or the anchor conductive vias 522, 532, the stress may be dissipated in larger areas (such as the shielding plates 527, 535, the passivation layers 3016, 3026, and/or the encapsulant 400), and delamination or cracking of the redistribution structure 5014 may be consequently reduced or eliminated. As such, manufacturing yield and reliability of the semiconductor device SD2 may be increased.

Figure 23:
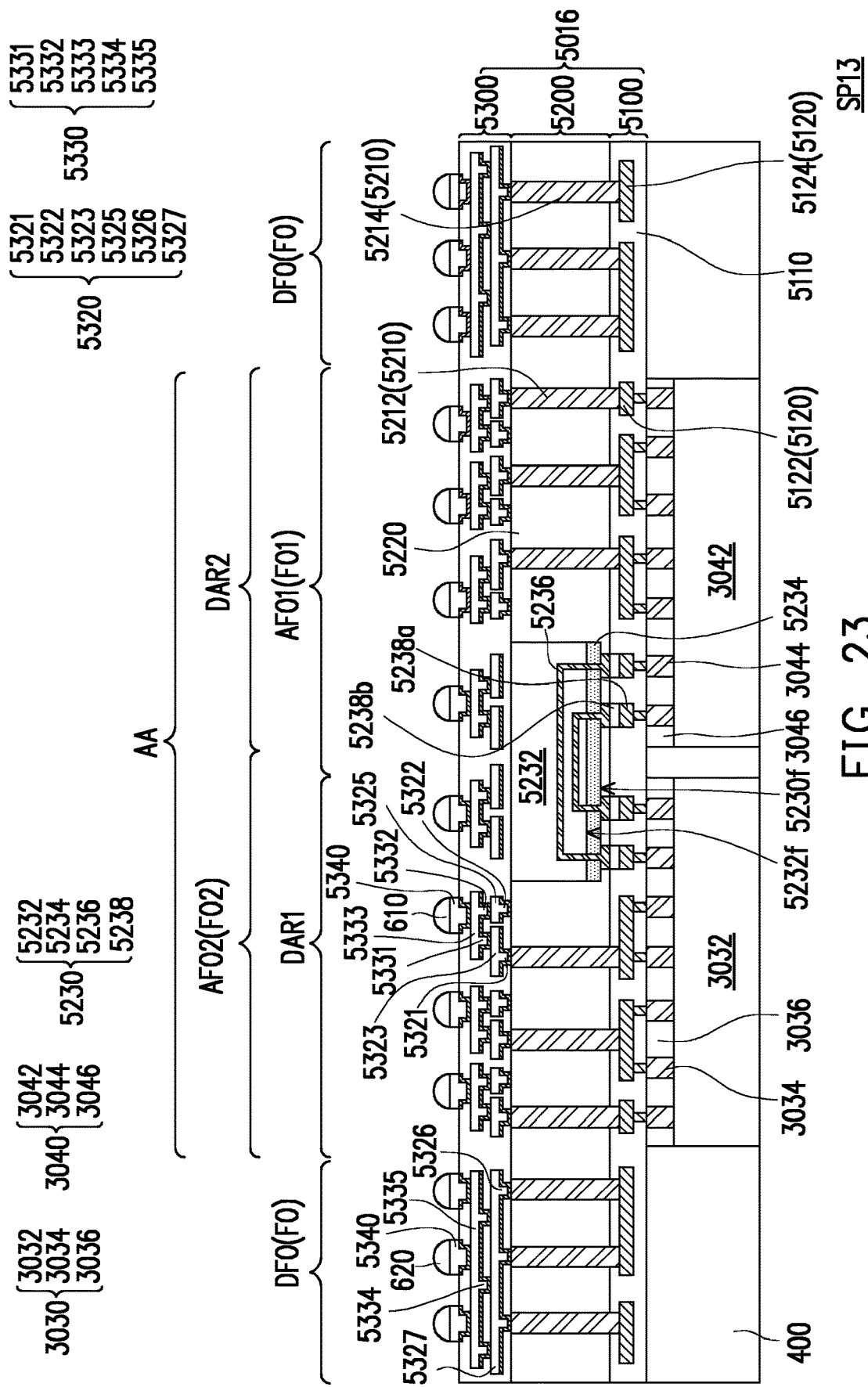
FIG. 23 is a schematic cross-sectional view illustrating a semiconductor package in accordance with some embodiments of the disclosure.

FIG. 23 is a schematic cross-sectional view of a semiconductor package SP13 according to some embodiments of the disclosure. In some embodiments, features of the semiconductor package SP13 may be similar to the features discussed above for the semiconductor package SP1 of FIG. 1E and SP12 of FIG. 21. For example, the semiconductor package SP13 may include multiple semiconductor dies 3030, 3040 interconnected by the redistribution structure 5016. In some embodiments, the redistribution structure 5016 includes the redistribution layers 5100, 5300 and the bridging layer 5200 disposed in between the redistribution layers 5100 and 5300. In some embodiments, the redistribution layer 5100 includes a dielectric layer 5110 and one or more metallization tiers 5120. The metallization tier 5120 includes routing conductive traces 5122 which are electrically connected to the contact pads 3034, 3044 of the semiconductor dies 3020, 3030, and dummy conductive traces 5124 which are electrically disconnected from the semiconductor dies 3020, 3030. In some embodiments, the dummy conductive traces 5124 may be electrically floating.

The bridging layer 5200 may include TIVs 5210 electrically connecting the redistribution layer 5100 to the redistribution layer 5300, an encapsulant 5220 surrounding the TIVs 5210, and a semiconductor bridge 5230 embedded in the encapsulant 5220 beside the TIVs 5210. The semiconductor bridge 5230 is connected to the semiconductor dies 3030, 3040 by the routing conductive traces 5122. As illustrated in FIG. 23, in some embodiments, the semiconductor bridge 5230 includes a semiconductor substrate 5232, a dielectric layer 5234 disposed at a front surface 5232f of the semiconductor bridge 5230, and interconnection conductive patterns 5236 embedded in the dielectric layer 5234 and in the semiconductor substrate 5232. The semiconductor substrate 5232 may be made of suitable semiconductor materials, similar to what was previously discussed for the semiconductor substrates 302 of the semiconductor dies 300 (illustrated, e.g., in FIG. 1B). The interconnection conductive patterns 5236 are in electrical contact with conductive terminals 5238 formed on the dielectric layer 5234 at the front surface 5230f of the semiconductor bridge 5230. The conductive terminals 5238 may be micro-bumps. For example, the conductive terminals 5238 may include a conductive post 5238a and a solder cap 5238b disposed on the conductive post 5238a. In some embodiments, the conductive posts 5238a may be copper posts. However, the disclosure is not limited thereto, and other conductive structures such as solder bumps, gold bumps or metallic bumps may also be used as the conductive terminals 5238. In some embodiments, the semiconductor bridge 5230 is disposed with the front surface 5230f directed towards the semiconductor dies 3030, 3040, so that the conductive terminals 5238 can be bonded to the routing conductive traces 5122. In some embodiments, the interconnection conductive patterns 5236 of the semiconductor bridge 5230 electrically interconnect the semiconductor dies 3030 and 3040. The conductive terminals 5238 may be bonded to the redistribution layer 5100 through a reflow process. Upon bonding the semiconductor bridge 5230, electrical connection between the semiconductor dies 3030 and 3040 is established through the inner redistribution layer 5100, the conductive terminals 5238, and the interconnection conductive patterns 5236. In some embodiments, the inner redistribution layer 5100 does not directly interconnect the semiconductor dies 3030, 3040. In some embodiments, the semi-conductor bridge 5030 connects at least one routing conductive trace 5122 electrically connected to the semiconductor die 3030 to another routing conductive trace 5122 electrically connected to the semiconductor die 3040. In some embodiments, the semiconductor bridge 5230 connects one or more routing conductive traces 5122 overlying the semiconductor die 3030 with one or more routing conductive traces 5122 overlying the semiconductor die 3040. In some embodiments, where a gap exists between adjacent semiconductor dies 3030, 3040, the semiconductor bridge 5230 extends over such gap. In some embodiments, the semiconductor bridge 5230 functions as an interconnecting structure for adjacent semiconductor dies 3030, 3040 and provides shorter electrical connection paths between the adjacent semiconductor dies 3030, 3040.

The outer redistribution layer 5300 may be similar to the redistribution structure 500 of FIG. 1E. For example, the redistribution layer 5300 may include a dielectric layer 5310 and one or more metallization tiers 5320, 5330 embedded in the dielectric layer 5310. The metallization tiers 5320, 5330 include the active conductive vias 5321, 5331 and the routing conductive traces 5323, 5333 which route signals to and from the semiconductor dies 3030, 3040 to the active connective terminals 610 through the intervening under-bump metallurgies 5340. Furthermore, the metallization tiers 5320, 5330 may include the anchor conductive vias 522, 532 and the anchor conductive traces 525 which may transfer the stress generated at the active connective terminals 610 to the encapsulant 5220. Furthermore, the metallization tiers 5320, 5330 may include the shielding plates 5327, 5335 in the dummy fan-out region DFO, possibly connected to the dummy conductive vias 5334 and 5326. The TIVs 5210 may include active TIVs 5212 and dummy TIVs 5214. The active TIVs 5212 electrically connect the routing conductive traces 5122 to the active conductive vias 5221 of the redistribution layer 5300, while the dummy TIVs 5214 may connect the dummy conductive traces 5124 to the dummy conductive vias 5226 of the redistribution layer 5300. Therefore, the stress generated at the active connective terminals 610 or at the dummy connective terminals 620 may be efficiently dissipated to the encapsulant 5220, the TIVs 5214, or the dummy conductive traces 5124, and delamination or cracking of the redistribution structure 5016 may be consequently reduced or eliminated. As such, manufacturing yield and reliability of the semiconductor package SP13 may increase.

In some embodiments, it is also possible to combine the features of the embodiments presented above. For example, while in FIG. 21 and in FIG. 23 the shielding plates 527 are connected to the shielding plates 535 and the shielding plates 5327 are connected to the shielding plates 5335 by intervening dummy conductive vias 534, 5334, in some alternative embodiments the dummy conductive vias 534, 5334 may be omitted, as illustrated for the semiconductor package SP3 in FIG. 12. In some embodiments, the dummy conductive vias 526, 5326 may also be omitted. In the semiconductor package SP1 of FIG. 1E the dummy conductive vias 526 are illustrated as connected to the dummy TIVs 220, and the anchor conductive vias 522 are illustrated as connected to the encapsulant 400. However, the disclosure is not limited thereto. In some alternative embodiments, the dummy conductive vias 526 of the semiconductor package SP1 may be connected to the encapsulant as illustrated for the semiconductor package SP12 in FIG. 21, even when some TIVs 200 are included in the semiconductor package SP1. Also, the anchor vias 522 may be connected to the passivation layer 306 of the semiconductor die 300, rather than to the encapsulant 400. These and other combinations of the embodiments discussed above are contemplated within the scope of the present disclosure.

In accordance with some embodiments of the disclosure, a semiconductor package includes a semiconductor die, a redistribution structure and connective terminals. The redistribution structure is disposed on the semiconductor die and includes a first metallization tier disposed in between a pair of dielectric layers. The first metallization tier includes routing conductive traces electrically connected to the semiconductor die and a shielding plate electrically insulated from the semiconductor die. The connective terminals include dummy connective terminals and active connective terminals. The dummy connective terminals are disposed on the redistribution structure and are electrically connected to the shielding plate. The active connective terminals are disposed on the redistribution structure and are electrically connected to the routing conductive traces. Vertical projections of the dummy connective terminals fall on the shielding plate.

In accordance with some embodiments of the disclosure, a semiconductor package includes a semiconductor die, an encapsulant, a redistribution structure, and a connective terminal. The semiconductor die includes a semiconductor substrate, contact pads, and a passivation layer. The contact pads are formed at a top surface of the semiconductor substrate. The passivation layer is formed at the top surface of the semiconductor substrate and exposes the contact pads. The encapsulant laterally surrounds the semiconductor die. The redistribution structure is disposed on the semiconductor die and the encapsulant. The redistribution structure includes a first dielectric layer, a first conductive trace, a first conductive via, a second conductive via, and a connective terminal. The first conductive trace is disposed on the first dielectric layer. The first conductive via is disposed in the first dielectric layer, in physical contact with the first conductive trace and one of the encapsulant or the passivation layer. The second conductive via is disposed on the first conductive trace and vertically overlaps with the first conductive via. The connective terminal is disposed over and is electrically connected to the second conductive via.

In accordance with some embodiments of the disclosure, a manufacturing method of a semiconductor package includes the following steps. A semiconductor die is provided. The semiconductor die includes a semiconductor substrate, contact pads, and a passivation layer. The contact pads are formed at a top surface of the semiconductor substrate. The passivation layer is formed at the top surface of the semiconductor substrate and exposes the contact pads. The semiconductor die is molded in an encapsulant. A redistribution structure is formed on the encapsulant. Forming the redistribution structure includes the following steps. A first dielectric layer is formed. The first dielectric layer includes first openings and second openings. A conductive material is deposited in the first openings and the second openings to form conductive vias. Each one of the first openings exposes at least one of the encapsulant and the passivation layer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a die having an active surface and a backside surface opposite to the active surface;
an encapsulant laterally wrapping the die;
a redistribution structure disposed on the active surface of the die and on the encapsulant, wherein the redistribution structure includes:
routing conductive traces electrically connected with the die; and
a shielding plate electrically insulated from the die; and
connective terminals disposed on the redistribution structure, wherein the connective terminals include:
dummy connective terminals disposed on the shielding plate and electrically connected to the shielding plate; and
active connective terminals disposed on the routing conductive traces and electrically connected to the die through the routing conductive traces.

2. The package of claim 1, wherein a vertical projection of the shielding plate is located outside and not overlapped with a vertical projection of the die.

3. The package of claim 1, wherein the shielding plate is located at a corner of the package.

4. The package of claim 1, wherein the shielding plate comprises multiple shielding plates, and each of the multiple shielding plates is connected with multiple dummy connective terminals of the dummy connective terminals.

5. The package of claim 4, wherein different shielding plates of the multiple shielding plates are located at respective corners of the package.

6. The package of claim 1, wherein the shielding plate has an annular shape and underlays an outermost ring of the dummy connective terminals.

7. The package of claim 1, wherein the shielding plate includes mesh holes misaligned with respect to vertical projections of the dummy connective terminals.

8. The package of claim 1, wherein the redistribution structure further comprises anchor conductive vias disposed below the active connective terminals.

9. A package, comprising:
a die having an active surface and a backside surface opposite to the active surface;
an encapsulant laterally surrounding the die;
a redistribution structure disposed on the die and on the encapsulant, wherein the redistribution structure includes:
a first dielectric layer;
a first conductive trace disposed on the first dielectric layer;
a first conductive via disposed in the first dielectric layer and in physical contact with the first conductive trace and the encapsulant; and
a second conductive via disposed on the first conductive trace and vertically overlapping with the first conductive via; and
a first connective terminal disposed on the redistribution structure and electrically connected to the die through the second conductive via, wherein a vertical projection of the first connective terminal overlaps with vertical projections of the first and second conductive vias.

10. The package of claim 9, wherein the redistribution structure further comprises:

a second conductive trace disposed on the first dielectric layer;

a third conductive via disposed in the first dielectric layer and in physical contact with the second conductive trace and a dielectric layer on the active surface of the die; and a fourth conductive via disposed on the second conductive trace and vertically overlapping with the third conductive via.

11. The package of claim 10, further comprising a second connective terminal disposed on the redistribution structure and electrically connected to the die through the fourth conductive via.

12. The package of claim 10, further comprising through insulator vias disposed beside the die, penetrating through the encapsulant and electrically connected to the redistribution structure.

13. The package of claim 10, wherein a footprint of the first connective terminal is larger than a footprint of the second conductive via.

14. The package of claim 10, wherein the first conductive via has a ring shape, and a portion of the first dielectric layer is filled inside a central hole of the first conductive via.

15. A manufacturing method of a package, comprising:

providing semiconductor dies, each semiconductor die having contacts exposed from a passivation layer located on an active surface of each semiconductor die;

molding the semiconductor dies in an encapsulant;

forming a redistribution structure on the semiconductor dies and on the encapsulant, wherein forming the redistribution structure comprises:

forming a first dielectric layer having first openings above the semiconductor dies, second openings above the encapsulant and third openings, wherein the first openings expose the contacts, and the third openings expose at least one selected from the encapsulant and the passivation layer;

depositing a conductive material over the first dielectric layer and filling into the first openings, the second openings and the third openings; and forming first conductive patterns, shielding plates and second conductive patterns respectively over the first openings, the second openings and the third openings; and dicing through the redistribution structure and the encapsulant along cutting lanes into individual packages.

16. The manufacturing method of claim 15, wherein forming the redistribution structure further comprises:

forming conductive traces on the first dielectric layer;

forming a second dielectric layer over the first dielectric layer; and providing first connective terminals over the second dielectric layer and above the first conductive patterns, wherein the first connective terminals are electrically connected with the semiconductor dies through the first conductive patterns.

17. The manufacturing method of claim 16, wherein forming the redistribution structure further comprises providing second connective terminals over the second dielectric layer and vertically overlapping with the second conductive patterns, wherein the second connective terminals are electrically isolated from the semiconductor dies.

18. The manufacturing method of claim 15, further comprising providing through insulator vias around the semiconductor dies before molding the semiconductor dies, wherein the through insulator vias are molded in the encapsulant with the semiconductor die.

19. The manufacturing method of claim 18, wherein the second openings expose portions of the through insulator vias, and the shielding plates are in contact with the portions of the through insulator vias.

20. The manufacturing method of claim 18, wherein forming the redistribution structure further comprises providing second connective terminals over the second dielectric layer and vertically overlapping with the shielding plates, wherein the second connective terminals are electrically isolated from the semiconductor dies.

* * * * *